United States Patent
Li et al.

(10) Patent No.: US 11,727,886 B1
(45) Date of Patent: Aug. 15, 2023

(54) DISPLAY PANEL AND DRIVE METHOD THEREOF, AND DISPLAY APPARATUS

(71) Applicants: Wuhan Tianma Micro-Electronics Co., Ltd., Wuhan (CN); Wuhan Tianma MicroElectronics Co., Ltd. Shanghai Branch, Shanghai (CN)

(72) Inventors: Yue Li, Shanghai (CN); Peng Zhang, Shanghai (CN); Mengmeng Zhang, Shanghai (CN)

(73) Assignees: WUHAN TIANMA MICRO-ELECTRONICS CO., LTD., Wuhan (CN); WUHAN TIANMA MICROELECTRONICS CO., LTD. SHANGHAI BRANCH, Shanghai (CN)

( * ) Notice: Subject to any disclaimer, the term of this patent is extended or adjusted under 35 U.S.C. 154(b) by 0 days.

(21) Appl. No.: 17/940,587

(22) Filed: Sep. 8, 2022

(30) Foreign Application Priority Data

Jul. 1, 2022 (CN) .......................... 202210773500.3

(51) Int. Cl.
*G09G 3/3266* (2016.01)

(52) U.S. Cl.
CPC ... *G09G 3/3266* (2013.01); *G09G 2310/0213* (2013.01); *G09G 2310/08* (2013.01)

(58) Field of Classification Search
CPC .................................................. G09G 3/3674
See application file for complete search history.

(56) References Cited

U.S. PATENT DOCUMENTS

| | | | |
|---|---|---|---|
| 2005/0001805 A1* | 1/2005 | Jeon | G09G 3/3648 345/92 |
| 2010/0207927 A1* | 8/2010 | Joo | G09G 3/3677 345/204 |
| 2012/0120035 A1* | 5/2012 | Yang | G09G 3/3677 345/205 |
| 2012/0212517 A1* | 8/2012 | Ahn | G11C 19/28 345/77 |
| 2014/0225819 A1* | 8/2014 | Onuma | G09G 3/3648 345/87 |
| 2016/0012764 A1* | 1/2016 | Xu | G09G 3/3266 345/204 |

(Continued)

FOREIGN PATENT DOCUMENTS

CN 109637477 A 4/2019
CN 113257171 A 8/2021

*Primary Examiner* — Sepehr Azari
(74) *Attorney, Agent, or Firm* — Anova Law Group, PLLC

(57) ABSTRACT

A display panel, a drive method, and a display apparatus are provided in the present disclosure. The display region of the display panel includes a plurality of scan line units; and each scan line unit includes two scan lines which extend along the first direction and are arranged along a second direction. The method includes, for displaying M frames of pictures, receiving a scan drive signal sequentially by a plurality of scan lines arranged along the second direction; and for displaying N frames of pictures adjacent to the M frames of pictures, receiving the scan drive signal sequentially by the plurality of scan line units arranged along the second direction; and along the second direction, for each same scan line unit, receiving the scan drive signal by an ith scan line after an (i+1)th scan line receives the scan drive signal.

12 Claims, 13 Drawing Sheets

(56) References Cited

U.S. PATENT DOCUMENTS

2016/0188087 A1* 6/2016 Sun ................. G06F 3/0446
                                                345/173
2018/0059497 A1* 3/2018 Lee ................. G09G 3/3677
2021/0327388 A1* 10/2021 Iwase ............... G09G 3/3674

* cited by examiner

US 11,727,886 B1

DISPLAY PANEL AND DRIVE METHOD THEREOF, AND DISPLAY APPARATUS

CROSS-REFERENCE TO RELATED APPLICATION

This application claims the priority of Chinese Patent Application No. 202210773500.3, filed on Jul. 1, 2022, the content of which is incorporated herein by reference in its entirety.

TECHNICAL FIELD

The present disclosure generally relates to the field of display technology and, more particularly, relates to a display panel and a drive method thereof, and a display apparatus.

BACKGROUND

With the development of information society, display apparatus requirements for displaying information are also increased. Therefore, users have higher demands for flat panel displays with small size, light weight and desirable display effect.

As personal apparatuses become more popular, portable and/or wearable apparatuses are actively developed. In order to apply the display apparatus to the portable and/or wearable apparatus, the display apparatus needs to have low power consumption. However, the technology developed to date may limit fabricating display apparatuses with excellent low power consumption performance. For example, in the existing technology, when a display product is displayed at a low frequency, a one-drive-multiple design, such as a one-drive-two design, may normally be used to ensure that the frame of the display product is sufficiently small. The one-drive-multiple design indicates that one shift register drives multiple rows of pixels. For example, the one-drive-two design indicates that one shift register drives two rows of pixels. However, when the display product uses the one-drive-multiple design, the problem that one row is brighter and another row is darker in the picture display may easily occur, which may result in problems including flicker display pictures, non-uniform display effect, and/or the like, thereby affecting user experience. Therefore, there is a need to provide a method for reducing the problem of uneven display effect of the display apparatus.

SUMMARY

One aspect of the present disclosure provides a drive method of a display panel. The display panel includes a display region and a non-display region surrounding the display region, the display region includes a plurality of scan line units, and each scan line unit includes two scan lines which extend along a first direction and are arranged along a second direction. The method includes for displaying M frames of pictures, receiving a scan drive signal sequentially by a plurality of scan lines arranged along the second direction; and for displaying N frames of pictures adjacent to the M frames of pictures, receiving the scan drive signal sequentially by the plurality of scan line units arranged along the second direction; and along the second direction, for each same scan line unit, receiving the scan drive signal by an ith scan line after an (i+1)th scan line receives the scan drive signal, where $1 \le M \le 3$, M is an integer, $1 \le N \le 3$, N is a positive integer, and i=1.

Another aspect of the present disclosure provides a display panel. The display panel includes a display region and a non-display region surrounding the display region. The display region includes a plurality of scan line units, and each scan line unit includes two scan lines which extend along a first direction and are arranged along a second direction; and the non-display region further includes a first gate drive module and a second gate drive module, where the first gate drive module includes K cascaded first gate drive units connected with each other; the second gate drive module includes K cascaded second gate drive units connected with each other; and along the second direction, the K cascaded first gate drive units and the K cascaded second gate drive units are sequentially connected to a plurality of scan lines alternately, where K is a positive integer.

Another aspect of the present disclosure provides a display apparatus including a display panel. The display panel includes a display region and a non-display region surrounding the display region. The display region includes a plurality of scan line units, and each scan line unit includes two scan lines which extend along a first direction and are arranged along a second direction; and the non-display region further includes a first gate drive module and a second gate drive module, where the first gate drive module includes K cascaded first gate drive units connected with each other; the second gate drive module includes K cascaded second gate drive units connected with each other; and along the second direction, the K cascaded first gate drive units and the K cascaded second gate drive units are sequentially connected to a plurality of scan lines alternately, where K is a positive integer.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated into a part of the specification, illustrate embodiments of the present disclosure and together with the description to explain the principles of the present disclosure.

DETAILED DESCRIPTION

Figure 1:
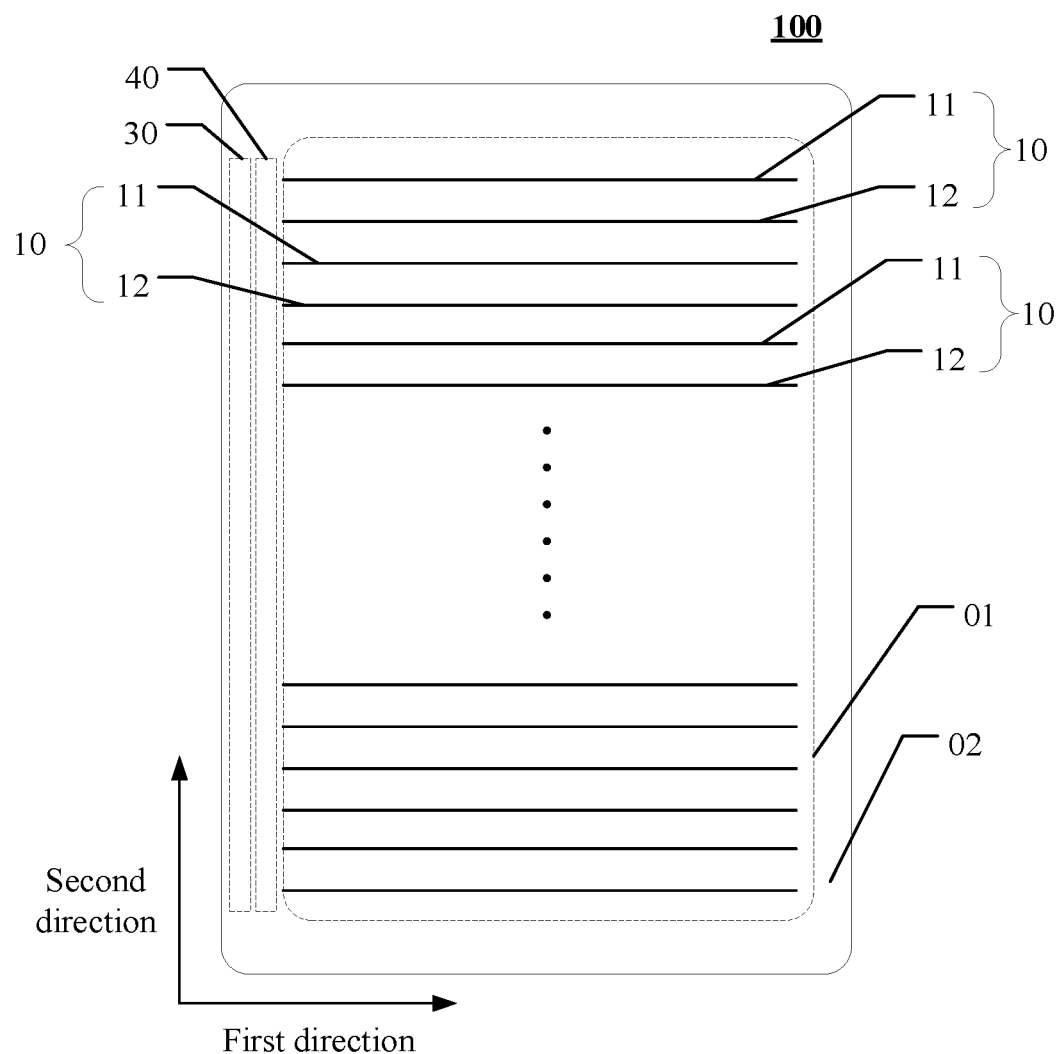
FIG. 1 illustrates a schematic of a display panel according to various embodiments of the present disclosure.

Various exemplary embodiments of the present disclosure are be described in detail with reference to accompanying drawings. It should be noted that unless specifically stated otherwise, relative configuration of components and steps, numerical expressions and numerical values described in these embodiments may not limit the scope of the present disclosure.

The following description of at least one exemplary embodiment may be merely illustrative and may not be used to limit the present disclosure and its application or use.

The technologies, methods, and apparatuses known to those skilled in the art may not be discussed in detail, but where appropriate, the technologies, methods, and apparatuses should be regarded as a part of the present disclosure.

In all examples shown and discussed herein, any specific value should be interpreted as merely exemplary, rather than as a limitation. Therefore, other examples in exemplary embodiment may have different values.

It should be noted that similar reference numerals and letters indicate similar items in the following drawings. Therefore, once an item is defined in one drawing, it does not need to be further discussed in the subsequent drawings.

In the existing technology, as personal apparatuses become more popular, portable and/or wearable apparatuses are actively developed. In order to apply the display apparatus to the portable and/or wearable apparatus, the display apparatus needs to have low power consumption. However, the technology developed to date may limit fabricating display apparatuses with excellent low power consumption performance. For example, in the existing technology, when a display product is displayed at a low frequency, a one-drive-multiple design, such as a one-drive-two design, may normally be used to ensure that the frame of the display product is sufficiently small. However, when the display product uses the one-drive-multiple design, the problem that one row is brighter and another row is darker in the picture display may easily occur, which may result in problems including flicker display pictures, non-uniform display effect, and/or the like, thereby affecting user experience. Therefore, there is a need to provide a method for reducing the problem of uneven display effect of the display apparatus.

The present disclosure provides a display panel and its drive method, and a display apparatus, which are configured to improve the problem of non-uniform picture display effect when the one-drive-multiple design is used.

Figure 2:
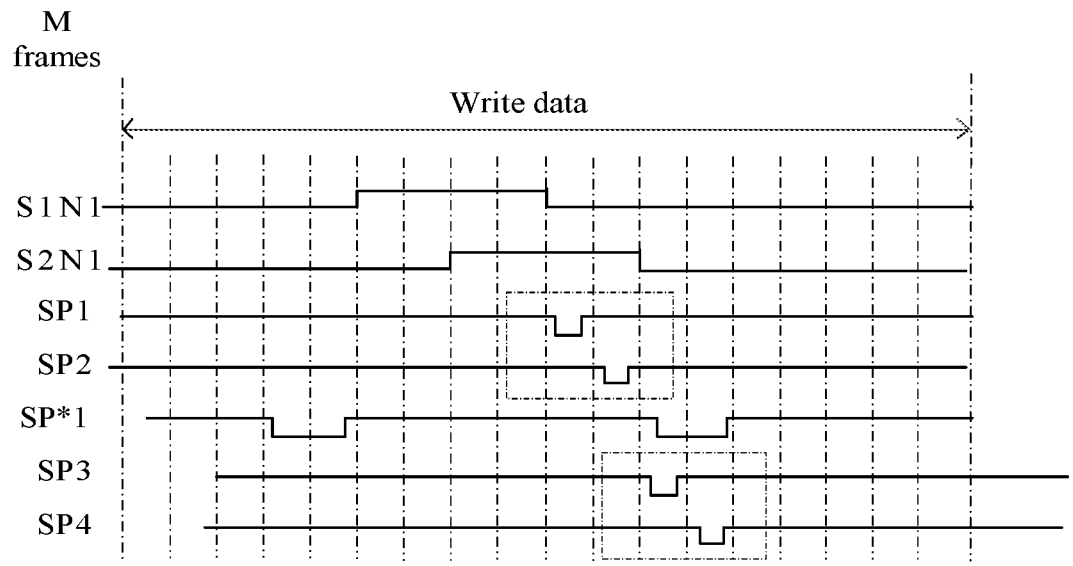
FIG. 2 illustrates a time sequence diagram of scan lines receiving scan drive signals in a display panel according to various embodiments of the present disclosure.
Figure 3:
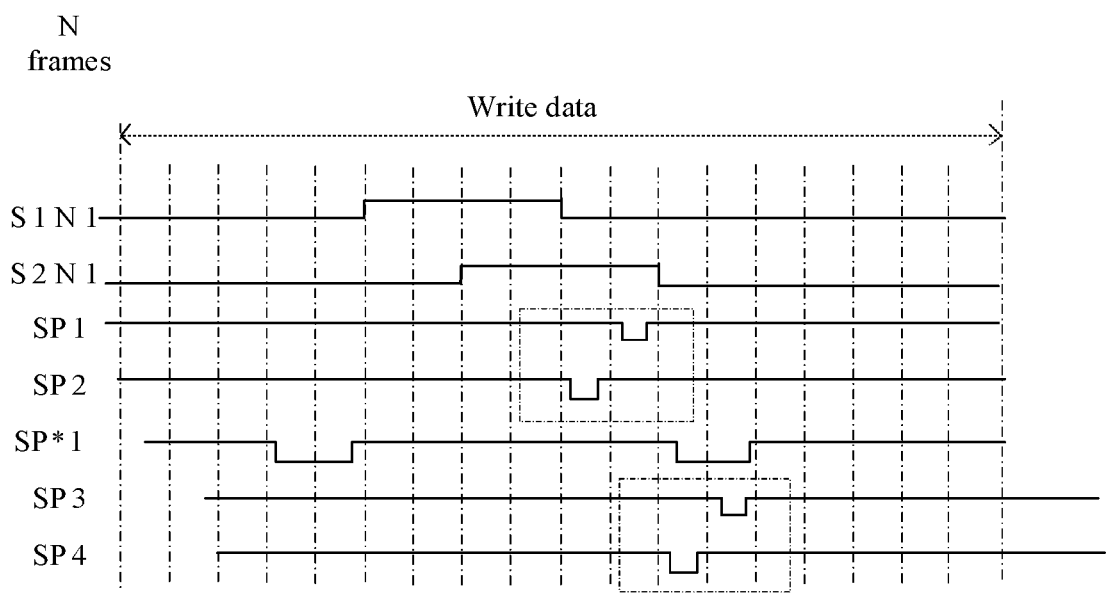
FIG. 3 illustrates another time sequence diagram of scan lines receiving a scan drive signal in a display panel according to various embodiments of the present disclosure.

FIG. 1 illustrates a schematic of a display panel according to various embodiments of the present disclosure. FIG. 2 illustrates a time sequence diagram of scan lines receiving scan drive signals in a display panel according to various embodiments of the present disclosure. FIG. 3 illustrates another time sequence diagram of scan lines receiving a scan drive signal in a display panel according to various embodiments of the present disclosure. Referring to FIGS. 1-3, the present disclosure provides a drive method of a display panel 100. The display panel 100 may include a display region 01 and a non-display region 02 surrounding the display region 01. The display region 01 may include a plurality of scan line units 10; and each scan line unit 10 may include two scan lines 11 and 12 which extend along the first direction and are arranged along the second direction.

The drive method of the display panel 100 may include that for displaying M frames of pictures, a plurality of scan lines 11 and 12 arranged along the second direction may receive a scan drive signal sequentially; for displaying N frames of pictures adjacent to the M frames of pictures, the plurality of scan line units 10 arranged along the second direction may receive the scan drive signal sequentially; and along the second direction, after the (i+1)th scan line 12 in each scan line unit 10 first receives the scan drive signal, the ith scan line 11 in a same scan line unit 10 may receive the scan drive signal, where $1 \leq M \leq 3$, M is an integer, $1 \leq N \leq 3$, N is a positive integer, and i=1.

For example, the present disclosure provides the drive method of the display panel 100, where the applied display panel 100 may include the display region 01 and the non-display region 02; and the non-display region 02 may be arranged around the display region 01. The display region 01 may include the plurality of scan line units 10 for transmitting scan signals to the pixel drive circuits corresponding to light-emitting elements in the display region 01. Each scan line unit 10 may include two scan lines 11 and 12. That is, in the present disclosure, every two scan lines 11 and 12 may be used as a scan line unit 10, and the scan lines 11 and 12 in a previous scan line unit 10 may not be included in a next scan line unit 10, in other words, such two scan line units may not be overlapped with each other. The plurality of scan lines 11 and 12 disposed in the display region 01 may all extend along the first direction and be arranged along the second direction.

Based on the configuration of the scan lines 11 and 12 in the display panel 100 provided above, the present disclosure provides an exemplary drive method of the display panel 100. For example, for displaying at least one frame of picture, all scan lines 11 and 12 arranged along the second direction may be controlled to receive the scan drive signal sequentially. In such way, the light-emitting elements which are disposed along the second direction in the display region 01 and electrically connected to the scan lines 11 and 12 in all rows may be sequentially driven. That is, as shown in FIG. 2, the scan line 11 which is connected to the first row and corresponds to SP1 may be first transmitted with the scan drive signal; next, the scan line 12 which is connected to the second row and corresponds to SP2 may be transmitted with the scan drive signal; next, the scan line 11 which is connected to the third row and corresponds to SP3 may be transmitted with the scan drive signal; next, the scan line 12 which is connected to the fourth row and corresponds to SP4 may be transmitted with the scan drive signal. Along the second direction, after the first scan line 11 in each scan line unit 10 first receives the scan drive signal, the second scan line 12 in the same scan line unit 10 may receive the scan drive signal.

Furthermore, in at least another frame of picture adjacent to above-mentioned at least one frame of picture, the plurality of scan line units 10 arranged along the second direction may be controlled to receive the scan drive signal sequentially. That is, the plurality of scan line units 10 arranged along the second direction may be sequentially transmitted with the scan drive signal. Based on above configuration, the present disclosure provides that each scan line unit 10 includes two scan lines 11 and 12, and the scan lines 11 and 12 included in each scan line unit 10 are not repeated. Therefore, the present disclosure may further configure two scan lines 11 and 12 included in each scan line unit 10 as that the second line may receive the scan drive signal after the first line. That is, as shown in FIG. 3, the scan line 12 which is connected to the second row and corresponds to SP2 may be first transmitted with the scan drive signal; next, the scan line 11 which is connected to the first row and corresponds to SP1 may be transmitted with the scan drive signal; next, the scan line 12 which is connected to the fourth row and corresponds to SP4 may be transmitted with the scan drive signal; next, the scan line 11 which is connected to the third row and corresponds to SP3 may be transmitted with the scan drive signal. Along the second direction, after the second scan line 12 in each scan line unit 10 first receives the scan drive signal, the first scan line 11 in the same scan line unit 10 may receive the scan drive signal.

Above-mentioned drive method of the display panel 100 provided by the present disclosure may realize that for displaying the M frames of pictures, the scan lines 11 and 12 may be applied with the scan drive signal in the order of 1, 2, 1, 2, 1, 2 . . . ; and for displaying of N frames of pictures adjacent to the M frames of pictures, the scan lines 11 and 12 may be applied with the scan drive signal in the order of 2, 1, 2, 1, 2, 1 . . . . For example, in one embodiment provided in the present disclosure, one display region 01 of the display panel 100 may include 10 scan lines 11 and 12; for displaying the M frames of pictures, the scan lines 11 and 12 may be applied with the scan drive signal in the order of 1, 2, 3, 4, 5, 6, 7, 8, 9, and 10; and for displaying the N frames of pictures adjacent to the M frames of pictures, the scan lines 11 and 12 may be applied with the scan drive signal in the order of 2, 1, 4, 3, 6, 5, 8, 7, 10, and 9. In such way, for example, for displaying the M frames of pictures, the luminous intensities of the light-emitting elements corresponding to odd-numbered rows may all be L1, and the luminous intensities of the light-emitting elements corresponding to even-numbered rows may all be L2. At this point, for displaying the N frames of pictures arranged adjacently to the M frames of pictures, the luminous intensities of the light-emitting elements corresponding to odd-numbered rows may all be L2, and the luminous intensities of the light-emitting elements corresponding to even-numbered rows may all be L1. Therefore, it may realize the display intensities of the M frames of pictures and the N frames of pictures may be superimposed and complemented, which is equivalent to perform superimposition-type complementation improvement on the M frames of pictures which are displayed as that odd-numbered rows are brighter and even-numbered rows are darker by using the N frames of pictures which are displayed as that odd-numbered rows are darker and even-numbered rows are brighter, thereby avoiding the problem that the human eye may recognize the bright and dark lines in the display region 01.

Furthermore, the present disclosure provides that the value of M may be 1, 2, or 3, and the value of N may be 1, 2, or 3, so that the frame period that uses superimposition-type complementation may be relatively small, thereby avoiding that the user may recognize the problem of bright and dark lines at different rows in the display pictures when the M frame period is excessively long or the N frame period is excessively long.

As disclosed above, through a related design based on the output time sequence of the scan drive signal in the present disclosure, in the process of displaying pictures on the display panel 100, the output time sequence of the scan drive signal may be adjusted every few frames. Therefore, for example, the M frames of pictures may be embodied as that odd-numbered rows are bright and even-numbered rows are dark, and the N frames of pictures may be embodied as that odd-numbered rows are dark and even-numbered rows are bright, thereby averaging the display intensities of the M frames of pictures and N frames of pictures which are adjacently configured after being superimposed. In such way, it may not only visually reduce the problem that one line is bright, and another line is dark when the one-drive-two design is used for the scan lines, and but also avoid the problem that the user recognizes that one row is bright and another row is dark in the display region 01, thereby improving the display uniformity of the display panel 100. Moreover, the human eye only recognizes such problem when the pictures last for a long time (long consecutive frame display) for being one row bright and another row dark. Therefore, in the present disclosure, the M frames of pictures may be embodied as that odd-numbered rows are bright and even-numbered rows are dark, and the N frames of pictures may be embodied as that odd-numbered rows are dark and even-numbered rows are bright; the value of M may not exceed 3; and the value of N may not exceed 3. In such way, the luminous intensities of the pictures observed by the human eye may be superimposed and averaged in a short period of time, which may visually improve the problem that one row is bright, and another row is dark, thereby improving the display effect of the display panel 100.

Referring to FIGS. 1-3, optionally, M=1 and N=1.

For example, the present disclosure also provides an optional configuration manner as the following: the M value is 1, and N value is also 1. That is, a plurality of adjacent display frames may use the following configuration. For example, in odd-numbered frames, scan lines 11 and 12 may be applied with the scan drive signal in the order of 1, 2, 1, 2, 1, 2 . . . , and in even-numbered frames, the scan lines 11 and 12 may be applied with the scan drive signal in the order of 2, 1, 2, 1, 2, 1 . . . ; or in even-numbered frames, the scan lines 11 and 12 may be applied with the scan drive signal in the order of 1, 2, 1, 2, 1, 2 . . . , and in odd-numbered frames, the scan lines 11 and 12 may be applied with the scan drive signal in the order of 2, 1, 2, 1, 2, 1 . . . .

Through using such configuration, for example, in the display of odd-numbered frames, the luminous intensities of the light-emitting elements corresponding to the odd-numbered rows may all be L1, and the luminous intensities of the light-emitting elements corresponding to the even-numbered rows may all be L2; at this point, in the display of even-numbered frames which are arranged adjacent to the odd-numbered frames, the luminous intensities of the light-emitting elements corresponding to the odd-numbered rows may all be L2, and the luminous intensities of the light-emitting elements corresponding to the even-numbered rows may all be L1. Therefore, it may realize the display intensities of two adjacent frames of pictures may be superimposed and complemented. It is equivalent to perform superimposition-type complementation improvement on the odd-numbered frames of pictures which are displayed as that odd-numbered rows are brighter and even-numbered rows are darker by using the even-numbered frames of pictures which are displayed as that odd-numbered rows are darker and even-numbered rows are brighter, thereby avoiding the problem that the human eye may recognize the bright and dark lines in the display region 01. Or, in the display of even-numbered frames, the luminous intensities of the light-emitting elements corresponding to the odd-numbered rows may all be L1, and the luminous intensities of the light-emitting elements corresponding to the even-numbered rows may all be L2; at this point, in the display of odd-numbered frames which are arranged adjacent to the even-numbered frames, the luminous intensities of the light-emitting elements corresponding to the odd-numbered rows may all be L2, and the luminous intensities of the light-emitting elements corresponding to the even-numbered rows may all be L1. Therefore, it may realize the display intensities of two adjacent frames of pictures may be superimposed and complemented. It is equivalent to perform superimposition-type complementation improvement on the even-numbered frames of pictures, which are displayed as that odd-numbered rows are brighter and even-numbered rows are darker, using the odd-numbered frames of pictures, which are displayed as that odd-numbered rows are darker and even-numbered rows are brighter, thereby avoiding the problem that the human eye may recognize the bright and dark lines in the display region 01.

That is, compared with above-mentioned technical solutions in which the value of M is 2 or 3, or the value of N is 2 or 3, the speed at which the bright and dark lines are superimposed and complemented for improvement may be accelerated, and any two adjacent frames may perform an intensity complementation, which may further avoid the problem that the human eye may recognize the bright and dark lines in the display region 01, further improve the display uniformity of the display panel 100, such that the display effect of the display panel 100 may be desirable.

Figure 4:
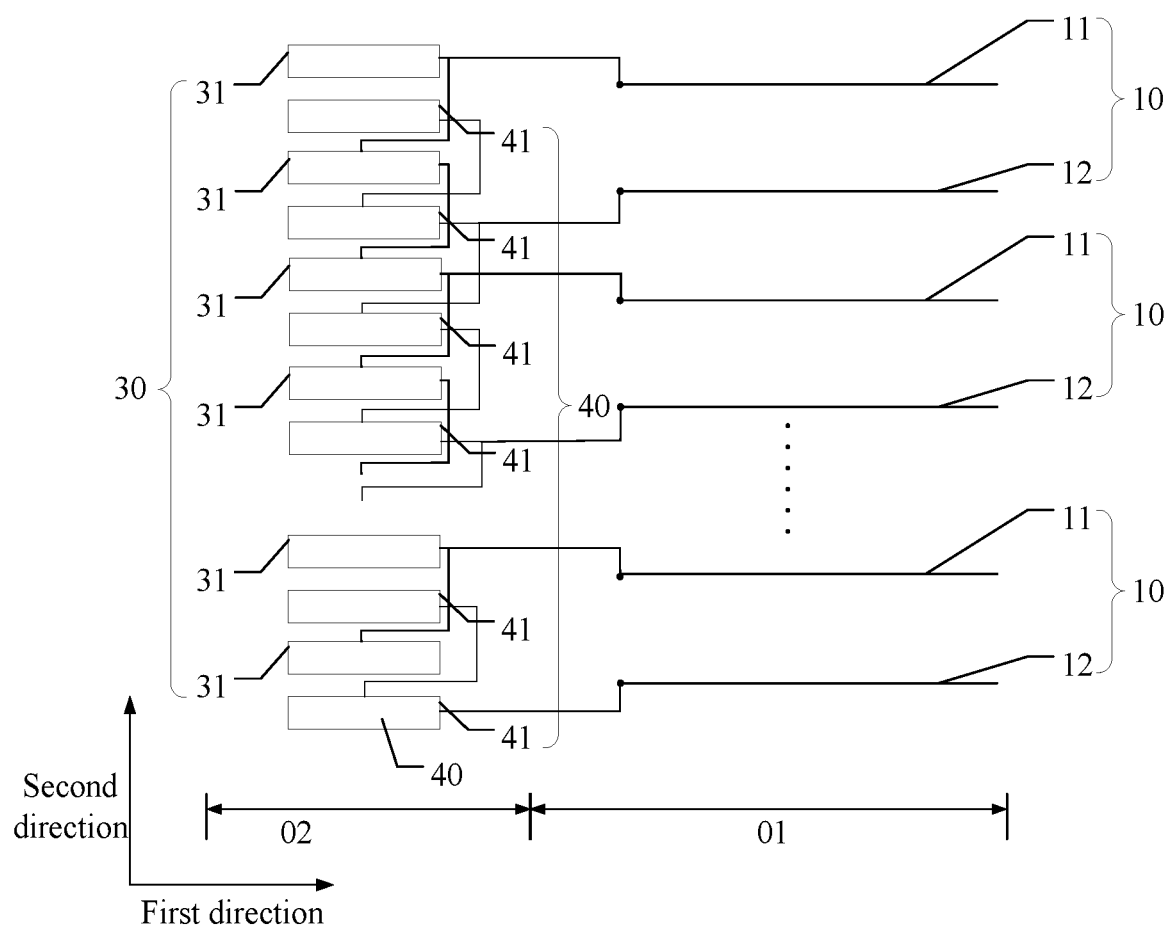
FIG. 4 illustrates a schematic of a circuit structure in a display panel according to various embodiments of the present disclosure.

FIG. 4 illustrates a schematic of a circuit structure in a display panel according to various embodiments of the present disclosure. Referring to FIGS. 1-4, optionally, the non-display region 02 of the display panel 100 may further include a first gate drive module 30 and a second gate drive module 40; the first gate drive module 30 may include K cascaded first gate drive units 31 connected with each other; the second gate drive module 40 may include K cascaded second gate drive units 41 connected with each other; and along the second direction, the first gate drive unit 31 and the second gate drive unit 41 may be sequentially connected to the scan lines 11 and 12 alternately, where, K is a positive integer.

Along the second direction, the first gate drive units 31 and the second gate drive units 41 may be sequentially and alternately arranged.

The drive method of the display panel 100 may include that for displaying the M frames of pictures, along the second direction, after the scan line 11 (also referred to as ith scan line 11) in each scan line unit 10 first receives the scan drive signal transmitted by the first gate drive unit 31, the scan line 12 (also referred to as (i+1)th scan line 12) in a same scan line unit 10 may receive the scan drive signal transmitted by the second gate drive unit 41; and for displaying the N frames of pictures adjacent to the M frames of pictures, along the second direction, after the scan line 12 (also referred to as (i+1)th scan line 12) in each scan line unit 10 first receives the scan drive signal transmitted by the second gate drive unit 41, the scan line 11 (also referred to as ith scan line 11) in a same scan line unit 10 may receive the scan drive signal transmitted by the first gate drive unit 31.

For example, the present disclosure also provides components disposed in the non-display region 02 of the display panel 100 for electrical connection with the scan lines 11 and 12; and the first gate drive module 30 and the second gate drive module 40 may be disposed in the non-display region 02. Both the first gate drive module 30 and the second gate drive module 40 may be configured to include a plurality of gate drive units. For example, the first gate drive module 30 may be configured to include K cascaded first gate drive units 31 connected with each other, and the second gate drive module 40 may be configured to include K cascaded second gate drive units 41 connected with each other. In addition, along the second direction, the first gate drive units 31 and the second gate drive units 41 may be connected to the scan lines 11 and 12 alternately and sequentially; and along the second direction, the first gate drive units 31 and the second gate drive units 41 may be arranged alternately and sequentially, that is, the first gate drive units 31 and the second gate drive units 41 may be arranged in a row along the second direction.

For such structure, the present disclosure provides a drive method of the display panel 100. For example, for displaying the M frames of pictures, along the second direction, each scan line unit 10 may include two scan lines 11 and 12; and it may configure that the first scan line 11 in each scan line unit 10 may first receive the scan drive signal transmitted from the first gate drive unit 31, and the second scan line 12 in the same scan line unit 10 may then receive the scan drive signal transmitted from the second gate drive unit 41. That is, the scan lines 11 of the odd-numbered rows may receive the scan drive signal transmitted from the first gate drive unit 31; the scan lines 12 of the even-numbered rows may receive the scan drive signal transmitted from the second gate drive unit 41; and for the same scan line unit 10, the scan line 11 of the odd-numbered row may receive the scan drive signal earlier than the scan line 12 of the even-numbered row.

It should also be noted that the odd-numbered first gate drive units 31 in the first gate drive module 30 may be configured to be electrically connected to the scan lines 11; and the even-numbered second gate drive units 41 in the second gate drive module 40 may be configured to be electrically connected to the scan lines 12.

For such configuration, the drive method of the display panel 100 provided by the present disclosure may further include, for displaying the N frames of pictures adjacent to the M frames of pictures, along the second direction, for example, when each scan line unit 10 may include two scan lines 11 and 12, it may configure that the second scan line 12 in each scan line unit 10 may first receive the scan drive signal transmitted from the second gate drive unit 41, and the first scan line 11 in the same scan line unit 10 may then receive the scan drive signal transmitted from the first gate drive unit 31. That is, for the same scan line unit 10, the scan line 12 of the even-numbered row may receive the scan drive signal earlier than the scan line 11 of the odd-numbered row. However, the electrical connection relationship between the gate drive units (e.g., the first gate drive unit 31 and the second gate drive unit 41) and the scan lines 11 and 12 may not need to be adjusted, and only the transmission sequence of the scan drive signal may be adjusted.

That is, in the present disclosure, the picture display luminous intensities may be configured to be superimposed and complemented for displaying the M frames of pictures and for displaying the N frames of pictures arranged to be adjacent to the M frames of pictures. It is equivalent to perform superimposition-type complementation improvement on the N frames of pictures which are displayed as that odd-numbered rows are brighter and even-numbered rows are darker by using the M frames of pictures which are displayed as that odd-numbered rows are darker and even-numbered rows are brighter, thereby avoiding the problem that the human eye may recognize the bright and dark lines in the display region 01, improving the display uniformity of the display panel 100, and making the display effect of the display panel 100 to be desirable.

Figure 5:
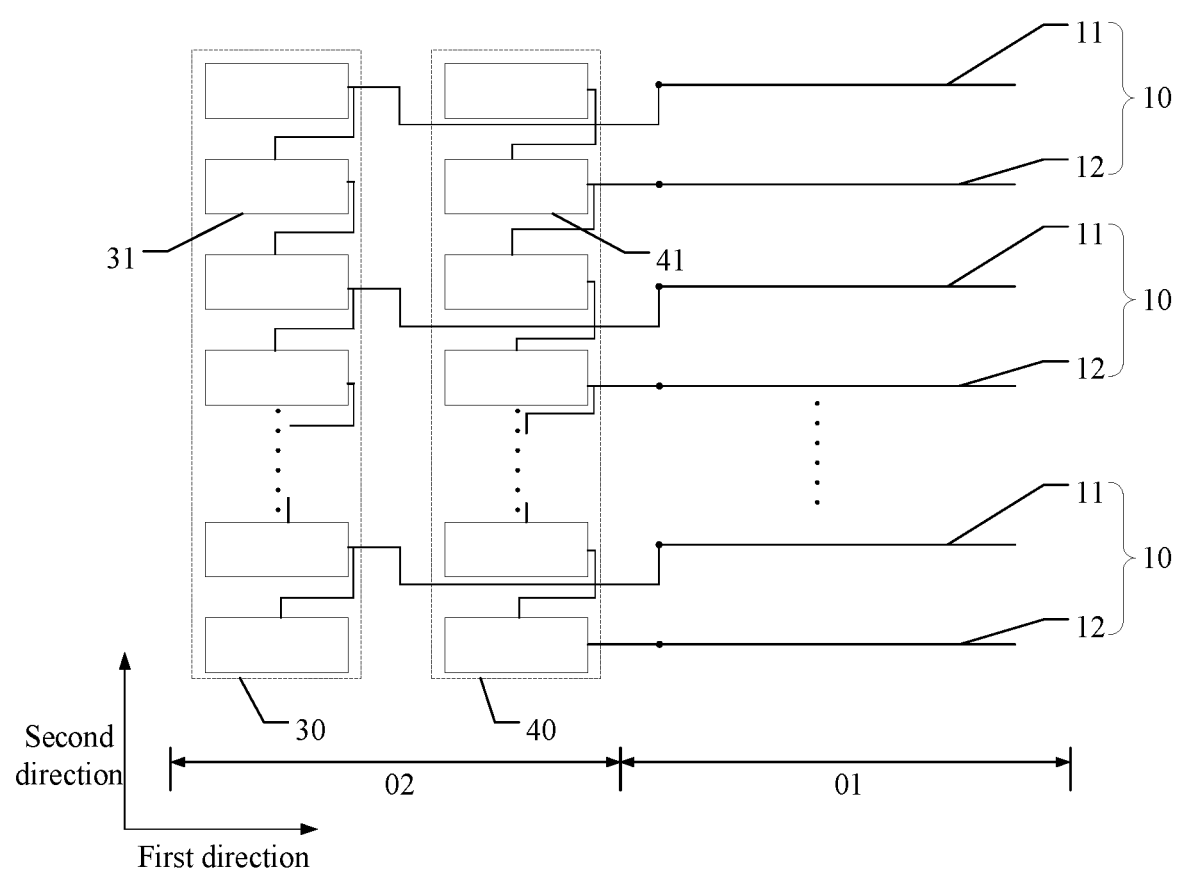
FIG. 5 illustrates another schematic of a circuit structure in a display panel according to various embodiments of the present disclosure.

FIG. 5 illustrates another schematic of a circuit structure in a display panel according to various embodiments of the present disclosure. Referring to FIGS. 1-3 and 5, optionally, the non-display region 02 of the display panel 100 further may include the first gate drive module 30 and the second gate drive module 40; the first gate drive module 30 may include K cascaded first gate drive units 31 connected with each other; the second gate drive module 40 may include K cascaded second gate drive units 41 connected with each other; and along the second direction, the first gate drive units 31 and the second gate drive units 41 may be connected to the scan lines 11 and 12 alternately and sequentially; where K is a positive integer.

Along the first direction, the second gate drive module 40 may be on the side of the first gate drive module 30 adjacent to the display region 01, or the second gate drive module 40 may be on the side of the display region 01 away from the first gate drive module 30. In addition, K first gate drive units 31 may be sequentially arranged along the second direction, and K second gate drive units 41 may be sequentially arranged along the second direction.

The drive method of the display panel 100 may include that for displaying the M frames of pictures, along the second direction, after the ith scan line 11 in each scan line unit 10 first receives the scan drive signal transmitted by the first gate drive unit 31, the (i+1)th scan line 12 in the same scan line unit 10 may receive the scan drive signal transmitted by the second gate drive unit 41; and for displaying the N frames of pictures adjacent to the M frames of pictures, along the second direction, after the (i+1)th scan line 12 in each scan line unit 10 first receives the scan drive signal transmitted by the second gate drive unit 41, the ith scan line 11 in the same scan line unit 10 may receive the scan drive signal transmitted by the first gate drive unit 31.

For example, the present disclosure also provides components provided in the non-display region 02 of the display panel 100 for electrical connection with the scan lines 11 and 12; and the first gate drive unit 31 and the second gate drive unit 41 may be configured in the non-display region 02. The first gate drive module 30 and the second gate drive module 40 may each be configured to include a plurality of gate drive units, which may be, for example, that the first gate drive module 30 may be configured to include K cascaded first gate drive units 31 connected with each other, and the second gate drive module 40 may be configured to include K cascaded second gate drive units 41 connected with each other. Along the second direction, the first gate drive units 31 and the second gate drive units 41 may be connected to the scan lines 11 and 12 alternately and sequentially.

In addition, in the present disclosure, along the first direction, the second gate drive module 40 may be configured to be on the side of the first gate drive module 30 adjacent to the display region 01, or the second gate drive module 40 may be configured to be on the side of the first gate drive module 30 adjacent to the display region 01. That is, the first gate drive module 30 and the second gate drive module 40 may be configured in two columns; all gate drive units (the first gate drive units 31) in the first gate drive module 30 may be arranged in a row along the second direction; all gate drive units (the second gate drive units 41) in the second gate drive module 40 may be arranged in another column along the second direction; and no overlapped region may be between two columns of gate drive units.

For such structure, the present disclosure provides a drive method of the display panel 100. For example, for displaying the M frames of picture, along the second direction, each scan line unit 10 may include two scan lines 11 and 12; and it may configure that the first scan line 11 in each scan line unit 10 may first receive the scan drive signal transmitted from the first gate drive unit 31, and the second scan line 12 in a same scan line unit 10 may then receive the scan drive signal transmitted from the second gate drive unit 41. That is, the scan lines 11 of the odd-numbered rows may receive the scan drive signal transmitted by the first gate drive unit 31; the scan lines 12 of the even-numbered rows may receive the scan drive signal transmitted by the second gate drive unit 41; and the scan lines 11 of the odd-numbered rows in the same scan-line unit 10 may receive the scan drive signal earlier than the scan lines 12 of the even-numbered rows.

It should also be noted that the odd number of first gate drive units 31 in the first gate drive module 30 may be configured to be electrically connected to the scan lines 11, and the even number of second gate drive units 41 in the second gate drive module 40 may be configured to be electrically connected to the scan lines 12 herein.

For such configuration, the drive method of the display panel 100 provided by the present disclosure may further include that, for displaying the N frames of pictures adjacent to the M frames of pictures, along the second direction, for example, when each scan line unit 10 includes two scan lines 11 and 12, it may configure that after the second scan line 12 in each scan line unit 10 first receives the scan drive signal transmitted from the second gate drive unit 41, the first scan line 11 in a same scan line unit 10 may then receive the scan drive signal transmitted by the first gate drive unit 31. That is, the scan lines 12 of the even-numbered rows in the same scan line unit 10 may receive the scan drive signal earlier than the scan lines 11 of the odd-numbered rows. However, the electrical connection relationship between the gate drive units and the scan lines 11 and 12 may not need to be adjusted, and only the transmission sequence of the scan drive signals may be adjusted.

That is, in the present disclosure, the picture display luminous intensities may be configured to be superimposed and complemented for displaying the M frames of pictures and for displaying the N frames of pictures arranged to be adjacent to the M frames of pictures. It is equivalent to perform superimposition-type complementation improvement on the N frames of pictures which are displayed as that odd-numbered rows are brighter and even-numbered rows are darker by using the M frames of pictures which are displayed as that odd-numbered rows are darker and even-numbered rows are brighter, thereby avoiding the problem that the human eye may recognize the bright and dark lines in the display region 01, improving the display uniformity of the display panel 100, and making the display effect of the display panel 100 to be desirable.

Figure 6:
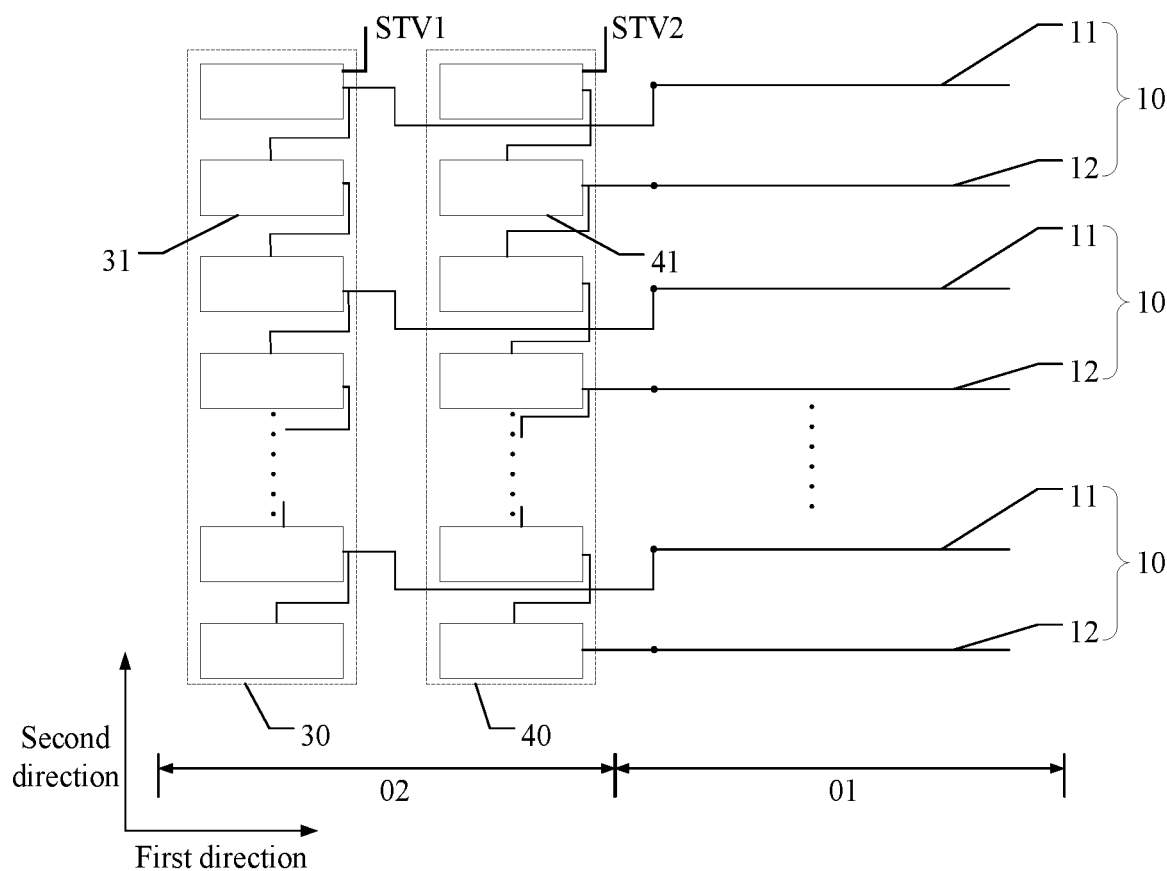
FIG. 6 illustrates another schematic of a circuit structure in a display panel according to various embodiments of the present disclosure.
Figure 7:
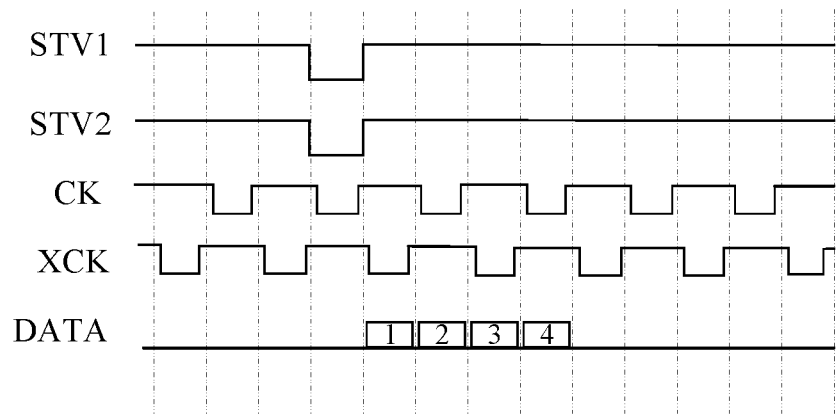
FIG. 7 illustrates a time sequence diagram according to various embodiments of the present disclosure.
Figure 8:
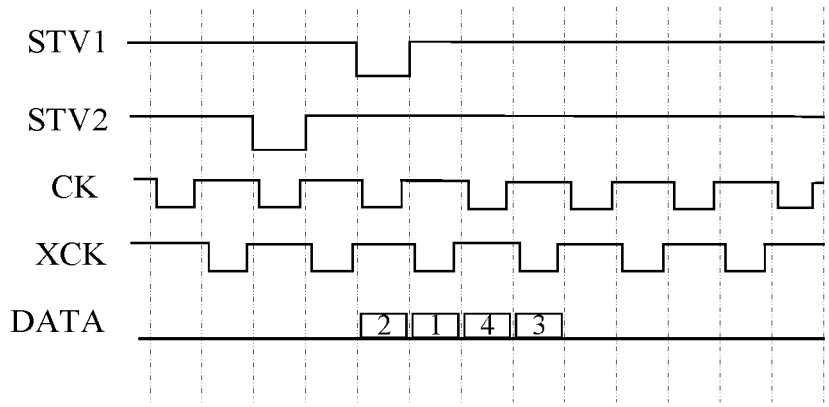
FIG. 8 illustrates another time sequence diagram according to various embodiments of the present disclosure.

FIG. 6 illustrates another schematic of a circuit structure in a display panel according to various embodiments of the present disclosure. FIG. 7 illustrates a time sequence diagram according to various embodiments of the present disclosure. FIG. 8 illustrates another time sequence diagram according to various embodiments of the present disclosure. Referring to FIGS. 1-3 and 6-8, optionally, the display panel 100 may further include a first start-up signal terminal STV1 and a second start-up signal terminal STV2; the first start-up signal terminal STV1 may be electrically connected to the first gate drive unit 31 of the first stage in the first gate drive module 30; and the second start-up signal terminal STV2 may be electrically connected to the second gate drive unit 41 of the first stage in the second gate drive module 40. The first start-up signal terminal STV1 may be configured to transmit the first start-up signal to the first gate drive unit 31 of the first stage in the first gate drive module 30; and the second start-up signal terminal STV2 may be configured to transmit the second start-up signal to the second gate drive unit 41 of the first stage in the second gate drive module 40.

The drive method of the display panel 100 may include that for displaying the M frames of pictures, the first start-up signal terminal STV1 and the second start-up signal terminal STV2 may transmit the first start-up signal and the second start-up signal simultaneously; and for displaying the N frames of pictures adjacent to the M frames of pictures, after the second start-up signal terminal STV2 transmits the second start-up signal, the first start-up signal terminal STV1 may transmit the first start-up signal.

For example, in addition to above-mentioned first gate drive module 30 and second gate drive module 40 in the display panel 100, the display panel 100 may further include the first start-up signal terminal STV1 and the second start-up signal terminal STV2 configured in the non-display region 02. The first start-up signal terminal STV1 may be configured to be electrically connected to the first gate drive unit 31 of the first stage in the first gate drive module 30 and transmit the first start-up signal to the first gate drive unit 31 of the first stage in the first gate drive module 30; and the first start-up signal may be transmitted to other cascaded first gate drive units 31 connected with each other through stage by stage. The second start-up signal terminal STV2 may be configured to be electrically connected to the second gate drive unit 41 of the first stage in the second gate drive module 40 and transmit the second start-up signal to the second gate drive unit 41 of the first stage in the second gate drive module 40; and the second start-up signal may be transmitted to other cascaded second gate drive units 41 connected with each other through stage by stage.

It should be noted that the configuration of the first start-up signal terminal STV1 and the second start-up signal terminal STV2 provided above, and their electrical connection relationship with the first gate drive module 30 and the second gate drive module 40 may be not related to whether the first gate drive module 30 and the second gate drive module 40 are arranged in one column or two columns.

Based on that the first start-up signal terminal STV1 and the second start-up signal terminal STV2 are configured, the present disclosure provides a drive method of the display panel 100 as the following. For example, when M takes a value of 1 and N takes a value of 1, as shown in FIG. 7, for displaying the odd-numbered frames of pictures, the first start-up signal terminal STV1 and the second start-up signal terminal STV2 may be configured to be turned on simultaneously; and the first start-up signal and the second start-up signal may be simultaneously transmitted to the first gate drive unit 31 of the first stage and the second gate drive unit 41 of the first stage which are electrically connected to the first start-up signal terminal STV1 and the second start-up signal terminal STV2. In the first gate drive module 30, odd-numbered first gate drive units 31 may be electrically connected to the scan lines 11; and in the second gate drive module 40, even-numbered second gate drive units 41 may be electrically connected to the scan lines 12. At this point, it may realize that after the first start-up signal terminal STV1 and the second start-up signal terminal STV2 transmit the first start-up signal and the second start-up signal simultaneously, in each scan line unit 10 including two scan lines 11 and 12, the first scan line 11 may first receive the scan drive signal transmitted by the first gate drive unit 31, and then the second scan line 12 may receive the scan drive signal transmitted from the second gate drive unit 41. Therefore, it may realize that for displaying odd-numbered frames of pictures, the scan lines 11 and 12 may be applied with the scan drive signal in the order of 1, 2, 1, 2, 1, 2 . . . (the order of 1, 2, 3, 4 . . . shown in FIG. 7).

On such basis, as shown in FIG. 8, for displaying even-numbered frames of pictures, the second start-up signal terminal STV2 may be configured to be turned on before the first start-up signal terminal STV1. The second start-up signal terminal STV2 may first transmit the second start-up signal to the second gate drive unit 41 of the first stage that is electrically connected to the second start-up signal terminal STV2; and then the first start-up signal terminal STV1 may transmit the first start-up signal to the first gate drive unit 31 of the first stage that is electrically connected to the first start-up signal terminal STV1. In the first gate drive module 30, odd-numbered first gate drive units 31 may be electrically connected to the scan lines 11; and in the second gate drive module 40, even-numbered second gate drive units 41 may be electrically connected to the scan lines 12. At this point, it may realize that in each scan line unit 10 including two scan lines 11 and 12, the second scan line 12 may first receive the scan drive signal transmitted by the second gate drive unit 41; and then the first scan line 11 in the same scan line unit 10 may receive the scan drive signal transmitted from the first gate drive unit 31. Therefore, for displaying even-numbered frames of pictures, the scan lines 11 and 12 may be applied with the scan drive signal in the order of 2, 1, 2, 1, 2, 1 . . . (the order of 2, 1, 4, 3 . . . shown in FIG. 8).

That is, in the present disclosure, by configuring the start-up time of the first start-up signal terminal STV1 and the second start-up signal terminal STV2 to be different, the order of the rows in which the pictures are turned on may be different, so that the picture display luminous intensities may be superimposed and complemented in displaying odd-numbered frames of pictures and even-numbered frames of pictures. It is equivalent to perform superimposition-type complementation improvement on the N frames of pictures which are displayed as that odd-numbered rows are brighter and even-numbered rows are darker by using the M frames of pictures which are displayed as that odd-numbered rows are darker and even-numbered rows are brighter, thereby avoiding the problem that the human eye may recognize the bright and dark lines in the display region 01, improving the display uniformity of the display panel 100, and making the display effect of the display panel 100 to be desirable.

Figure 9:
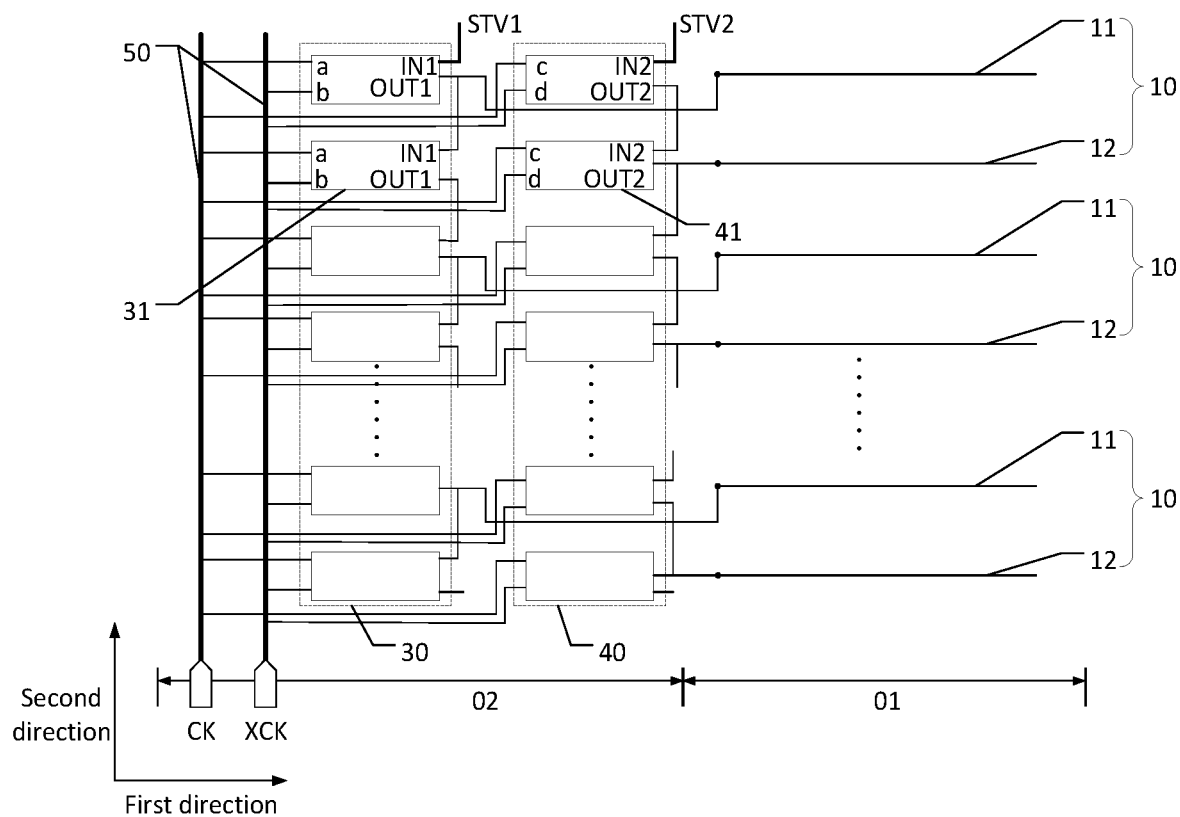
FIG. 9 illustrates another schematic of a circuit structure in a display panel according to various embodiments of the present disclosure.
Figure 10:
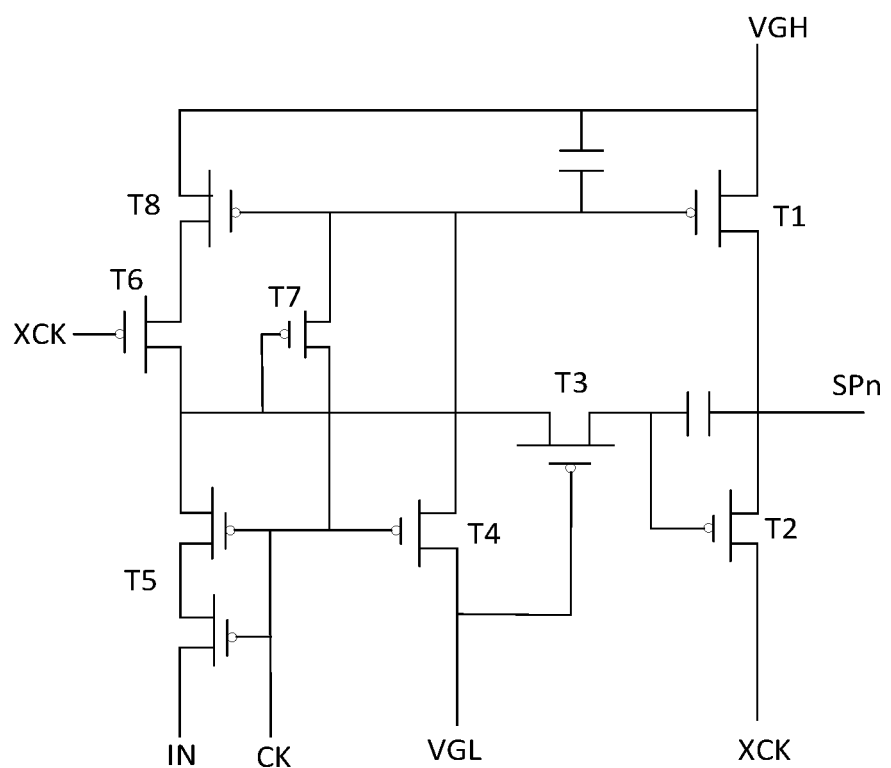
FIG. 10 illustrates a circuit structure schematic of a gate drive unit according to various embodiments of the present disclosure.

FIG. 9 illustrates another schematic of a circuit structure in a display panel according to various embodiments of the present disclosure. FIG. 10 illustrates a schematic of a circuit structure of a gate drive unit according to various embodiments of the present disclosure. Referring to FIGS. 1-3 and 6-10, optionally, the display panel 100 may further include a first clock signal line group 50; the first clock signal line group 50 may include a first clock signal line CK and a second clock signal line XCK; the first clock signal line CK and the second clock signal line XCK may be respectively configured to transmit the first clock signal and the second clock signal to the first gate drive unit 31 and the second gate drive unit 41; the first clock signal line CK may be electrically connected to each of the first gate drive units 31 and each of the second gate drive units 41; and the second clock signal line XCK may be electrically connected to each of the first gate drive units 31 and each of the second gate drive units 41.

The drive method of the display panel 100 may include that for displaying the M frames of pictures, the second clock signal and the first clock signal may be transmitted alternately and sequentially; and for displaying the N frames of pictures adjacent to the M frames of pictures, the first clock signal and the second clock signal may be transmitted alternately and sequentially.

For example, the display panel 100 provided by the present disclosure may further include the first clock signal line group 50. Each first clock signal line group 50 may include two clock signal lines which are the first clock signal line CK and the second clock signal line XCK. Two clock signal lines may be configured to transmit the first clock signal and the second clock signal to the first gate drive unit 31 and the second gate drive unit 41. For example, the first clock signal line CK may be configured to be electrically connected to each of the first gate drive units 31 and each of the second gate drive units 41; and the second clock signal line XCK may be configured to be electrically connected to each of the first gate drive units 31 and each of the second gate drive units 41.

Based on the configuration of above circuit structure, the present disclosure provides a drive method of the display panel 100 as the following. For example, when M is 1 and N is 1, for displaying of odd-numbered frames of pictures, the second clock signal and the first clock signal may be controlled to be transmitted sequentially, that is, the second clock signal may be transmitted to the gate drive unit before the first clock signal, and the second clock signal and the first clock signal may be both transmitted to the first gate drive unit 31 and the second gate drive unit 41; for displaying even-numbered frames of pictures, the first clock signal and the second clock signal may be controlled to be transmitted alternately and sequentially, that is, the first clock signal may be transmitted to the gate drive unit before the second clock signal, and the first clock signal and the second clock signal may be both transmitted to the first gate drive unit 31 and the second gate drive unit 41. Therefore, it may realize that, in actual picture implementation stage, the scan lines 11 and 12 may be applied with the scan drive signal in the order of 1, 2, 1, 2, 1, 2 . . . in displaying odd-numbered frames of pictures, and the scan lines 11 and 12 may be applied with the scan drive signal in the order of 2, 1, 2, 1, 2, 1 . . . in displaying even-numbered frames of pictures. In such way, it may realize that the order of the rows in which the pictures are turned on may be different, so that the picture display luminous intensities may be superimposed and complemented in displaying odd-numbered frames of pictures and even-numbered frames of pictures, thereby avoiding the problem that the human eye can recognize the bright and dark lines in the display region 01, improving the display uniformity of the display panel 100, and making the display effect of the display panel 100 to be desirable.

The circuit structure diagram of the first gate drive unit 31 and the second gate drive unit 41 shown in FIG. 10 may be an optional configuration manner provided by the present disclosure, which may not be limited in the present disclosure. Users may adjust circuit structure details of the first gate drive unit 31 and the second gate drive unit 41 according to actual needs.

Figure 11:
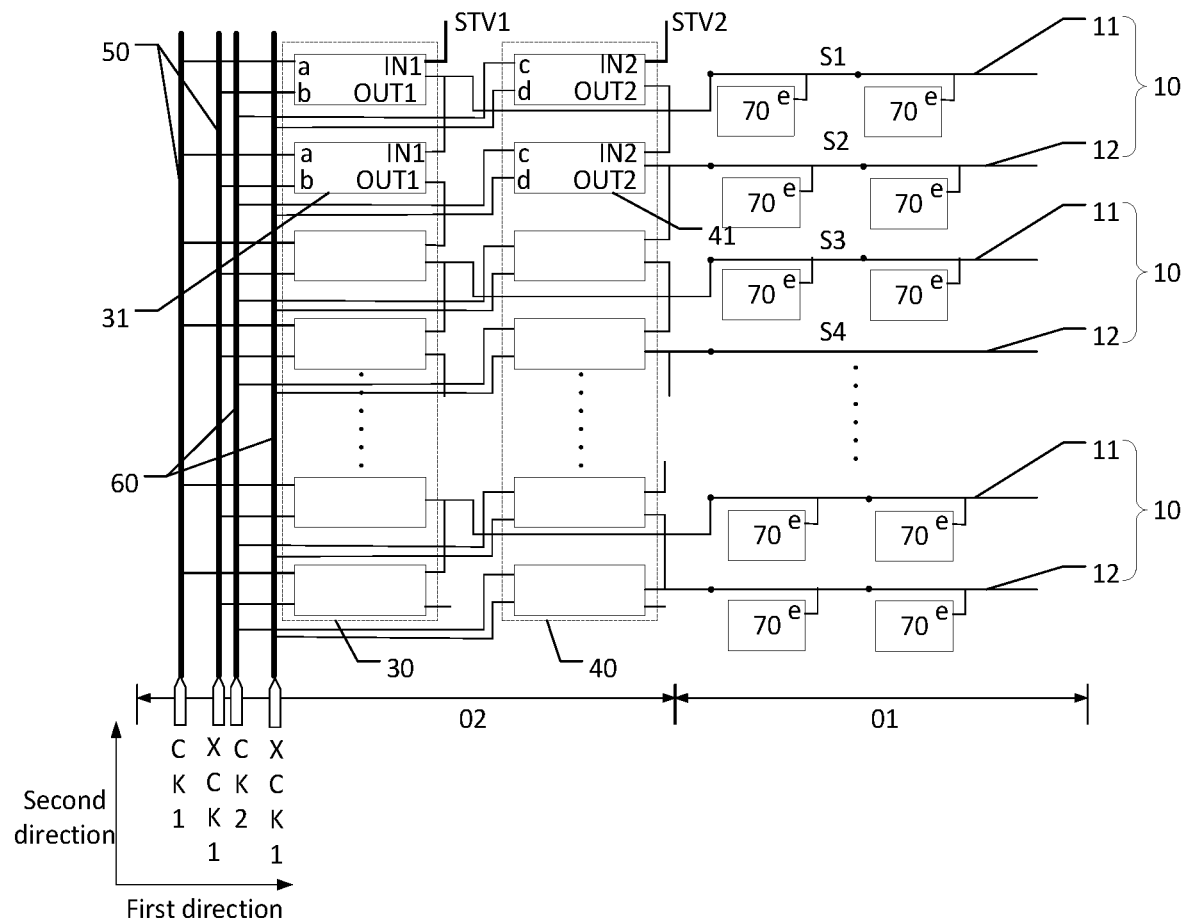
FIG. 11 illustrates another schematic of a circuit structure in a display panel according to various embodiments of the present disclosure.
Figure 12:
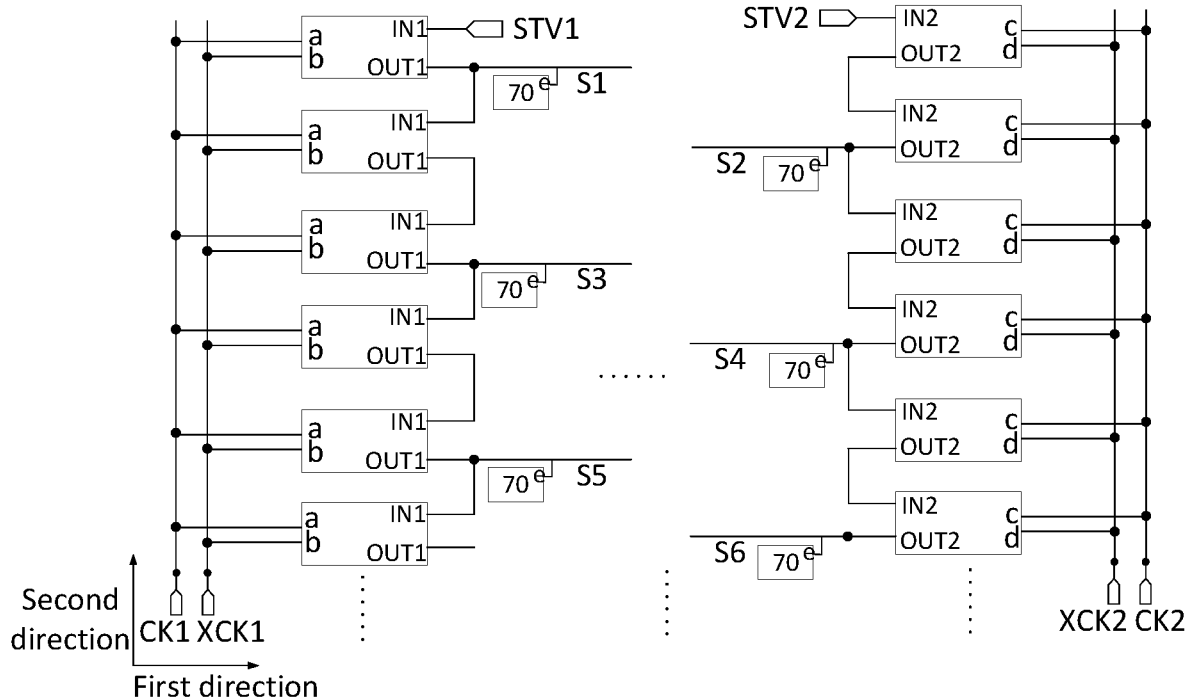
FIG. 12 illustrates another schematic of a circuit structure in a display panel according to various embodiments of the present disclosure.
Figure 13:
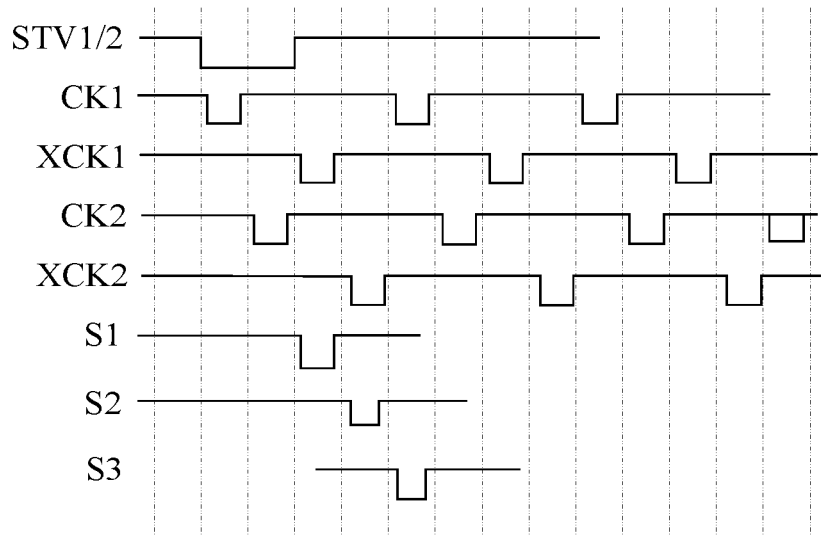
FIG. 13 illustrates another time sequence diagram according to various embodiments of the present disclosure.
Figure 14:
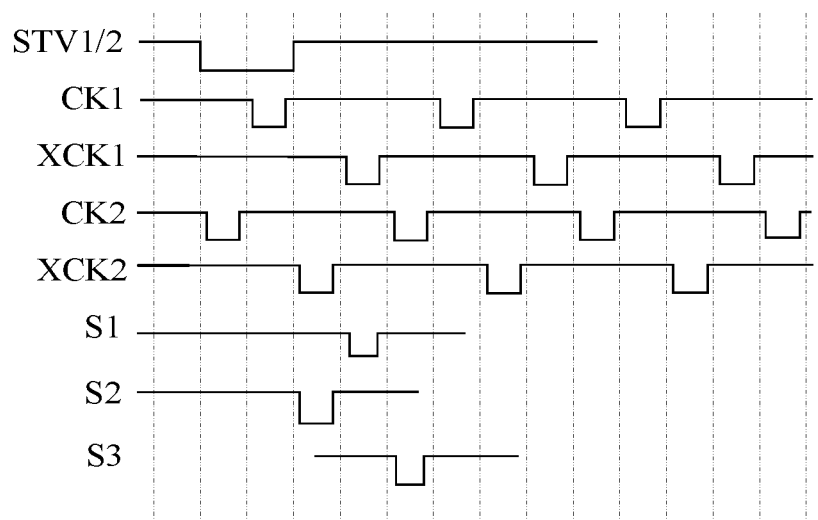
FIG. 14 illustrates another time sequence diagram according to various embodiments of the present disclosure.

FIG. 11 illustrates another schematic of a circuit structure in a display panel according to various embodiments of the present disclosure. FIG. 12 illustrates another schematic of a circuit structure in a display panel according to various embodiments of the present disclosure. FIG. 13 illustrates another time sequence diagram according to various embodiments of the present disclosure. FIG. 14 illustrates another time sequence diagram according to various embodiments of the present disclosure. Referring to FIGS. 1-3 and 6-14, optionally, the display panel 100 may further include a first clock signal line group 50 and a second clock signal line group 60; the first clock signal line group 50 may include a first clock signal line CK1 and a second clock signal line XCK1; the second clock signal line group 60 may include a third clock signal line CK2 and a fourth clock signal line XCK2; the first clock signal line CK1 may be configured to transmit the first clock signal to the first gate drive unit 31; the second clock signal line XCK1 may be configured to transmit the second clock signal to the first gate drive unit 31; the third clock signal line CK2 may be configured to transmit the third clock signal to the second gate drive unit 41; and the fourth clock signal line XCK2 may be configured to transmit the fourth clock signal to the second gate drive unit 41.

The first clock signal line CK1 may be electrically connected to each of the first gate drive units 31, and the second clock signal line XCK1 may be electrically connected to each of the first gate drive units 31.

The third clock signal line CK2 may be electrically connected to each of the second gate drive units 41, and the fourth clock signal line XCK2 may be electrically connected to each of the second gate drive units 41.

The drive method may include that for displaying the M frames of pictures, the first clock signal, the third clock signal, the second clock signal, and the fourth clock signal may be transmitted alternately and sequentially; and for displaying the N frames of pictures adjacent to the M frames of pictures, the third clock signal, the first clock signal, the fourth clock signal, and the second clock signal may be transmitted alternately and sequentially.

For example, the present disclosure also provides an optional configuration manner, that is, two clock signal line groups may be configured in the display panel 100. For example, two clock signal line groups may include the first clock signal line group 50 and the second clock signal line group 60. Each clock signal line group may include two clock signal lines. For example, the first clock signal line group 50 may be configured to include the first clock signal line CK1 and the second clock signal line XCK1; and the second clock signal line group 60 may be configured to include the third clock signal line CK2 and the fourth clock signal line XCK2. The first clock signal line CK1 may be configured to be electrically connected to each of the first gate drive units 31, the second clock signal line XCK1 may be configured to be electrically connected to each of the first gate drive units 31, the third clock signal line CK2 may be configured to be electrically connected to each of the second gate drive units 41, and the fourth clock signal line XCK2 may be configured to be electrically connected to each of the second gate drive units 41. Therefore, the first clock signal line CK1 may be configured to transmit the first clock signal to the first gate drive unit 31, the second clock signal line XCK1 may be configured to transmit the second clock signal to the first gate drive unit 31, the third clock signal line CK2 may be configured to transmit the third clock signal to the second gate drive unit 41, and the fourth clock signal line XCK2 may be configured to transmit the fourth clock signal to the second gate drive unit 41.

Based on the configuration of above circuit structure, the present disclosure provides a drive method of the display panel 100 as shown in FIGS. 13-14. For example, when M is 1 and N is 1, for displaying odd-numbered frames of pictures, the first clock signal, the third clock signal, the second clock signal, and the fourth clock signal may be controlled to be transmitted alternately and sequentially, that is, the first clock signal may be transmitted to its corresponding gate drive unit before the third clock signal, and then the second clock signal may be transmitted to its corresponding gate drive unit before the fourth clock signal; and for displaying even-numbered frames of pictures, the third clock signal, the first clock signal, the fourth clock signal, and the second clock signal may be controlled to be transmitted alternately and sequentially, that is, the third clock signal may be transmitted to its corresponding gate drive unit before the first clock signal, and then the fourth clock signal may be transmitted to its corresponding gate drive unit before the second clock signal. Therefore, it may realize that, in actual picture implementation stage, the scan lines 11 and 12 may be applied with the scan drive signal in the order of 1, 2, 1, 2, 1, 2 . . . in displaying odd-numbered frames of pictures, and the scan lines 11 and 12 may be applied with the scan drive signal in the order of 2, 1, 2, 1, 2, 1 . . . in displaying even-numbered frames of pictures. In such way, it may realize that the order of the rows in which the pictures are turned on may be different, so that the picture display luminous intensities may be superimposed and complemented in displaying odd-numbered frames of pictures and even-numbered frames of pictures, thereby avoiding the problem that the human eye can recognize the bright and dark lines in the display region 01, improving the display uniformity of the display panel 100, and making the display effect of the display panel 100 to be desirable.

It should be noted that, in one embodiment shown in FIG. 11, the first clock signal line group 50 and the second clock signal line group 60 may be configured in the non-display region 02 on a same side of the display panel 100; and in one embodiment shown in FIG. 12, the first clock signal line group 50 and the second clock signal line group 60 may be respectively configured in the non-display regions 02 on two sides of the display panel 100 along the first direction. These two embodiments are two optional configuration manners provided by the present disclosure, which may not be limited in the present disclosure. Users may adjust specific configuration of the clock signal line group according to their own needs. It should be noted that when the first clock signal line group 50 and the second clock signal line group 60 are respectively configured in the non-display regions 02 on two sides shown in FIG. 12, occupied areas of the non-display regions 02 on two sides may be equal to each other, such that the display region 01 in the display panel 100 may be configured to be centered, which may be beneficial for symmetrical beauty of the display panel 100.

Figure 15:
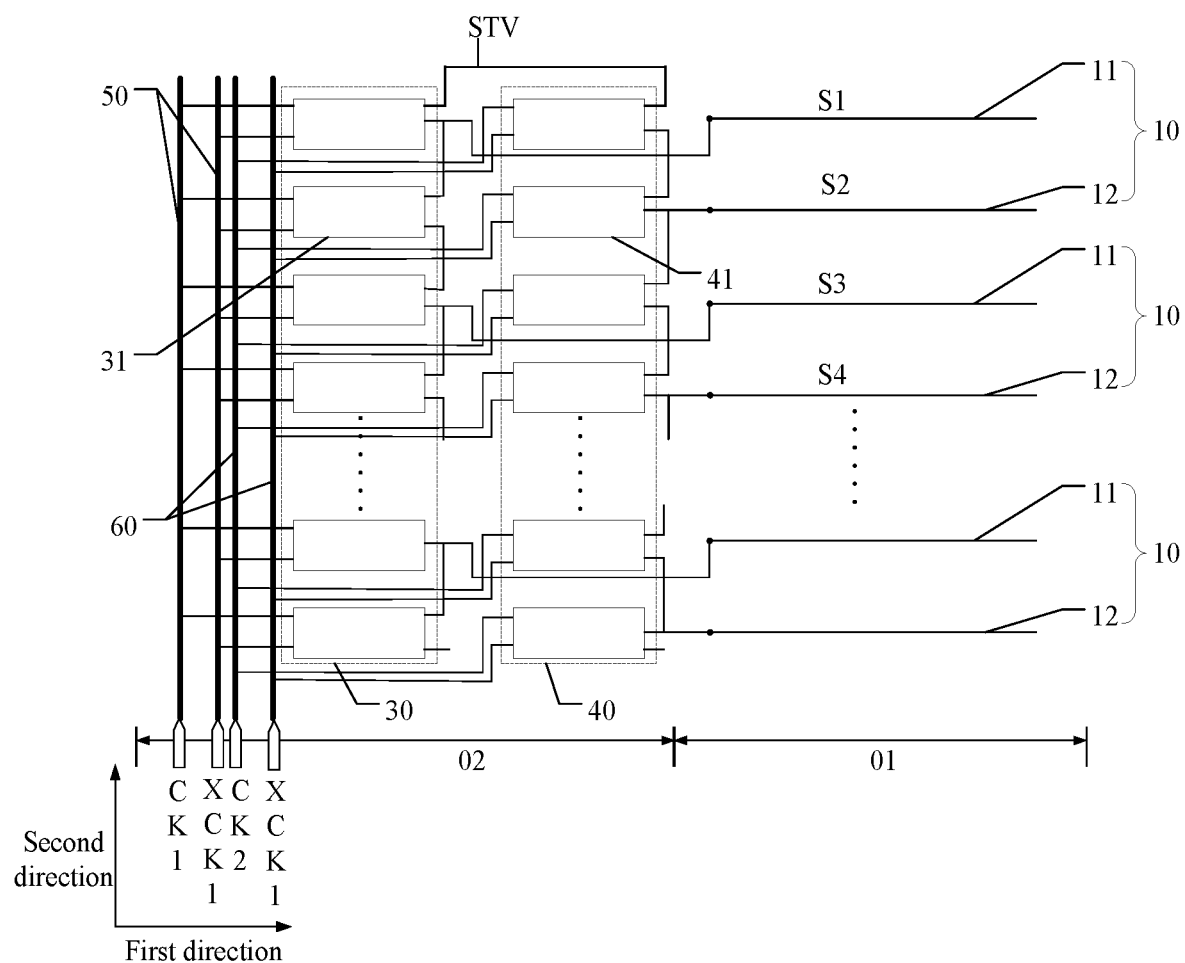
FIG. 15 illustrates another schematic of a circuit structure in a display panel according to various embodiments of the present disclosure.

FIG. 15 illustrates another schematic of a circuit structure in a display panel according to various embodiments of the present disclosure. Referring to FIGS. 1 and 13-15, optionally, the display panel 100 may further include the first start-up signal terminal STV; the first start-up signal terminal STV may be electrically connected to the first gate drive unit 31 of the first stage in the first gate drive module 30 and electrically connected to the second gate drive unit 41 of the first stage in the second gate drive module 40; and the first start-up signal terminal STV may be configured to transmit the first start-up signal to the first gate drive unit 31 of the first stage in the first gate drive module 30 and configured to transmit the first start-up signal to the second gate drive unit 41 of the first stage in the second gate drive module 40.

The drive method of the display panel 100 may include that for displaying the M frames of pictures, the first start-up signal terminal STV may simultaneously transmit the first start-up signal to the first gate drive unit 31 of the first stage and the second gate drive unit 41 of the first stage; and for displaying the N frames of pictures adjacent to the M frames of pictures, the first start-up signal terminal STV may simultaneously transmit the first start-up signal to the first gate drive unit 31 of the first stage and the second gate drive unit 41 of the first stage.

For example, only one first start-up signal terminal STV may be configured in the display panel 100. At this point, the first start-up signal terminal STV may be configured to be electrically connected to the first gate drive unit 31 of the first stage in the first gate drive module 30 and electrically connected to the second gate drive unit 41 of the first stage in the second gate drive module 40, which may omit the configuration of above-mentioned second start-up signal terminal STV2 and simplify the circuit structure of the display panel 100. For such configuration, the first start-up signal terminal STV may be configured to transmit the first start-up signal to the first gate drive unit 31 of the first stage in the first gate drive module 30 and also be configured to transmit the first start-up signal to the second gate drive unit 41 of the first stage in the second gate drive module 40.

Based on the configuration of above circuit structure, the present disclosure provides a drive method of the display panel 100 as the following. For example, when M is 1 and N is 1, for displaying odd-numbered frames of pictures, the first start-up signal terminal STV (e.g., STV1/2) may be controlled to transmit the first start-up signal to both the first gate drive unit 31 of the first stage and the second gate drive unit 41 of the first stage; as long as the first clock signal, the third clock signal, the second clock signal, and the fourth clock signal are controlled to be transmitted alternately and sequentially in displaying odd-numbered frames of pictures, it may realize that the scan lines 11 and 12 may be applied with the scan drive signal in the order of 1, 2, 1, 2, 1, 2 . . . ; for displaying even-numbered frames of pictures, the first start-up signal terminal STV (STV1/2) may also be controlled to transmit the first start-up signal to both the first gate drive unit 31 of the first stage and the second gate drive unit 41 of the first stage; as long as the third clock signal, the first clock signal, the fourth clock signal, and the second clock signal are controlled to transmitted alternately and sequentially in displaying even-numbered frames of pictures, it may realize that the scan lines 11 and 12 may be applied with the scan drive signal in the order of 2, 1, 2, 1, 2, 1 . . . . Therefore, it may realize that the picture display luminous intensities may be superimposed and complemented in displaying odd-numbered frames of pictures and even-numbered frames of pictures, thereby avoiding the problem that the human eye can recognize the bright and dark lines in the display region 01, improving the display uniformity of the display panel 100, and making the display effect of the display panel 100 to be desirable.

Referring to FIGS. 1 and 4-6, based on the same inventive concept, the present disclosure also provides the display panel 100, including the display region 01 and the non-display region 02 surrounding the display region 01. The display region 01 may include the plurality of scan line units 10, and each scan line unit 10 may include two scan lines 11 and 12 which extend along the first direction and are arranged along the second direction. The display panel 100 may include the first gate drive module 30 and the second gate drive module 40. The first gate drive module 30 may include K cascaded first gate drive units 31 connected with each other; the second gate drive module 40 may include K cascaded second gate drive units 41 connected with each other; and along the second direction, the first gate drive units 31 and the second gate drive units 41 may be connected to the scan lines 11 and 12 alternately and sequentially, where K is a positive integer.

For example, based on the same inventive concept, the present disclosure also provides the display panel 100. The display panel 100 may include the display region 01 and the non-display region 02, and the non-display region 02 may be arranged around the display region 01. The display region 01 may include the plurality of scan line units 10 for transmitting the scan signals to the pixel drive circuits corresponding to the light-emitting elements in the display region 01. Each scan line unit 10 may include two scan lines 11 and 12. That is, the present disclosure may use every two scan lines 11 and 12 as one scan line unit 10; and the scan lines 11 and 12 included in each scan line unit 10 may not be repeated. In addition, the plurality of scan lines 11 and 12 provided in the display region 01 may all extend in the first direction and be arranged along the second direction.

In the non-display region 02 of the display panel 100, the components electrically connected with the scan lines 11 and 12 may be configured; and the first gate drive unit 31 and the second gate drive unit 41 may be configured in the non-display region 02. Both the first gate drive module 30 and the second gate drive module 40 may be configured to include the plurality of gate drive units. For example, the first gate drive module 30 may be configured to include K cascaded first gate drive units 31 connected with each other, and the second gate drive module 40 may be configured to include K cascaded second gate drive units 41 connected with each other. Along the second direction, the first gate drive units 31 and the second gate drive units 41 may be connected to the scan lines 11 and 12 alternately and sequentially.

Referring to FIGS. 1, 5 and 6, optionally, along the second direction, the first gate drive units 31 and the second gate drive units 41 may be arranged alternately and sequentially; or along the first direction, the second gate drive module 40 may be on the side of the first gate drive module 30 adjacent to the display region 01; or the second gate drive module 40 may be on the side of the display region 01 away from the first gate drive module 30; and the K first gate drive units 31 may be sequentially arranged along the second direction, and the K second gate drive units 41 may be sequentially arranged along the second direction.

For example, when the non-display region 02 of the display panel 100 is configured with the first gate drive module 30 and the second gate drive module 40, the present disclosure provides at least two configuration manners of the first gate drive module 30 and the second gate drive module 40. For the first configuration manner, along the second direction, the first gate drive units 31 and the second gate drive units 41 may be arranged alternately and sequentially, that is, the first gate drive unit 31 and the second gate drive unit 41 may be arranged in a row along the second direction; at this point, the odd-numbered first gate drive units 31 in the first gate drive module 30 may be configured to be electrically connected to the scan lines 11 and 12; and the even-numbered second gate drive units 41 in the second gate drive module 40 may be configured to be electrically connected to the scan lines 11 and 12. For the second configuration manner, along the first direction, the second gate drive module 40 may be configured on the side of the first gate drive module 30 adjacent to the display region 01, or the second gate drive module 40 may be configured on the side of the first gate drive module 30 adjacent to the display region 01, that is, the first gate drive module 30 and the second gate drive module 40 may be arranged in two columns; all gate drive units in the first gate drive module 30 may be arranged in a row along the second direction, all gate drive units in the second gate drive module 40 may be arranged in another column along the second direction, and no overlapped region may be between two columns of gate drive units.

Referring to FIGS. 1 and 9, optionally, each first gate drive unit 31 may include a first clock signal receiving terminal a, a second clock signal receiving terminal b, a first drive signal receiving terminal IN1 and a first drive signal output terminal OUT1; and each second gate drive unit 41 may include a third clock signal receiving terminal c, a fourth clock signal receiving terminal d, a second drive signal receiving terminal IN2 and a second drive signal output terminal OUT2.

The display panel 100 may further include the first clock signal line group 50; and the first clock signal line group 50 may include the first clock signal line CK and the second clock signal line XCK. The first clock signal line CK may be electrically connected to the first clock signal receiving terminal a in each first gate drive unit 31 and electrically connected to the third clock signal receiving terminal c in each second gate drive unit 41. The second clock signal line XCK may be electrically connected to the second clock signal receiving terminal b of each first gate drive unit 31 and electrically connected to the fourth clock signal receiving terminal d of each second gate drive unit 41.

Each first drive signal output terminal OUT1 may be electrically connected to the scan line 11 in an odd-numbered row and be electrically connected to the first drive signal receiving terminal IN1 of the first gate drive unit 31 of a next stage. Each second drive signal output terminal OUT2 may be electrically connected to the scan line 12 of an even-numbered row and be electrically connected to the second drive signal receiving terminal IN2 of the second gate drive unit 41 of a next stage.

For example, the present disclosure provides an optional configuration manner that the non-display region 02 may be configured with the first clock signal line group 50; and the first clock signal line group 50 may include the first clock signal line CK and the second clock signal line XCK which are arranged along an arrangement direction in parallel with the scan lines 11 and 12. At this point, the first clock signal line CK may be configured to be electrically connected to the first clock signal receiving terminal a of each first gate drive unit 31 and electrically connected to the third clock signal of each second gate drive unit 41 terminal c. In such way, the first clock signal may be transmitted to the first clock signal receiving terminal a in the first gate drive unit 31 through the first clock signal line CK; and the first clock signal may be transmitted to the third clock signal receiving terminal c in the second gate drive unit 41. Meanwhile, the second clock signal line XCK may be configured to be electrically connected to the second clock signal receiving terminal b in each first gate drive unit 31 and be electrically connected to the fourth clock signal receiving terminal d in each second gate drive unit 41. In such way, the second clock signal may be transmitted to the second clock signal receiving terminal b in the first gate drive unit 31 through the second clock signal line XCK; and the second clock signal may be transmitted to the fourth clock signal receiving terminal d in the second gate drive unit 41.

On the basis of the configuration of above circuit structure, the first drive signal output terminal OUT1 of each first gate drive unit 31 may be further configured to be electrically connected to the scan line 11 of an odd-numbered row in the display region 01 and electrically connected to the first drive signal receiving terminal IN1 of the first gate drive unit 31 of a next stage. In such way, it may realize that the scan drive signal may be transmitted to the odd-numbered row scan line 11 through the first gate drive unit 31; the drive signal may be transmitted to the first gate drive unit 31 of a next stage; and the first gate drive unit 31 of the next stage may also transmit the scan drive signal to the scan line 11 of the odd-numbered row which is electrically connected to the first gate drive unit 31 of the next stage, thereby realizing the function of sequentially receiving the scan drive signal by the scan lines 11 of the odd-numbered rows. Meanwhile, each second drive signal output terminal OUT2 may be electrically connected to the scan line 12 of the even-numbered row in the display region 01 and be electrically connected to the second drive signal receiving terminal IN2 of the second gate drive unit 41 of the next stage. In such way, it may realize that the scan drive signal may be transmitted to the even-numbered row scan line 12 through the second gate drive unit 41; the drive signal may be transmitted to the second gate drive unit 41 of the next level; and the second gate drive unit 41 of the next stage may also transmit the scan drive signal to the scan line 12 of the even-numbered row which is electrically connected to the second gate drive unit 41 of the next stage, thereby realizing the function of sequentially receiving the scan drive signal by the scan lines 12 of the even-numbered rows.

Referring to FIGS. 7-8, on the basis of above circuit structure configuration, the present disclosure provides a drive method. For example, when M is 1 and N is 1, for displaying odd-numbered frames of pictures, the second clock signal and the first clock signal may be controlled to be transmitted sequentially, that is, the second clock signal may be transmitted to its corresponding gate drive unit before the first clock signal, and both the second clock signal and the first clock signal may be transmitted to the first gate drive unit 31 and the second gate drive unit 41; and for displaying even-numbered frames of pictures, the first clock signal and the second clock signal may be controlled to be transmitted sequentially, that is, the first clock signal may be transmitted to its corresponding gate drive unit before the second clock signal, and both the first clock signal and the second clock signal may be transmitted to the first gate drive unit 31 and the second gate drive unit 41. Therefore, it may realize that, in actual picture implementation stage, the scan lines 11 and 12 may be applied with the scan drive signal in the order of 1, 2, 1, 2, 1, 2 . . . in displaying odd-numbered frames of pictures; and the scan lines 11 and 12 may be applied with the scan drive signal in the order of 2, 1, 2, 1, 2, 1 . . . in displaying even-numbered frames of pictures. Therefore, it may realize that the picture display luminous intensities may be superimposed and complemented in displaying odd-numbered frames of pictures and even-numbered frames of pictures, thereby avoiding the problem that the human eye can recognize the bright and dark lines in the display region 01, improving the display uniformity of the display panel 100, and making the display effect of the display panel 100 to be desirable.

Referring to FIGS. 1, 11, 13 and 14, optionally, each first gate drive unit 31 may include the first clock signal receiving terminal a, the second clock signal receiving terminal b, the first drive signal receiving terminal IN1 and the first drive signal output terminal OUT1; and each second gate drive unit 41 may include the third clock signal receiving terminal c, the fourth clock signal receiving terminal d, the second drive signal receiving terminal IN2 and the second drive signal output terminal OUT2.

The display panel 100 may further include the first clock signal line group 50 and the second clock signal line group 60. The first clock signal line group 50 may include the first clock signal line CK1 and the second clock signal line XCK1; and the second clock signal line group 60 may include the third clock signal line CK2 and the fourth clock signal line XCK2.

The first clock signal line CK1 may be electrically connected to the first clock signal receiving terminal a in each first gate drive unit 31, and the second clock signal line XCK1 may be electrically connected to the second clock signal receiving terminal b in each first gate drive unit 31.

The third clock signal line CK2 may be electrically connected to the third clock signal receiving terminal c in each second gate drive unit 41, and the fourth clock signal line XCK2 may be electrically connected to the fourth clock signal receiving terminal d in each second gate drive unit 41.

Each first drive signal output terminal OUT1 may be electrically connected to the scan line 11 in an odd-numbered row and be electrically connected to the first drive signal receiving terminal IN1 of the first gate drive unit 31 of a next stage. Each second drive signal output terminal OUT2 may be electrically connected to the scan line 12 of an even-numbered row and be electrically connected to the second drive signal receiving terminal IN2 of the second gate drive unit 41 of a next stage.

For example, the present disclosure provides an optional configuration manner that the non-display region 02 may be configured with the first clock signal line group 50 and the second clock signal line group 60; and each clock signal line group may include two clock signal lines. For example, the first clock signal line group 50 may be configured to include the first clock signal line CK1 and the second clock signal line XCK1 arranged along the arrangement direction in parallel with the scan lines 11 and 12; and the second clock signal line group 60 may be configured to include the third clock signal line CK2 and the fourth clock signal line XCK2 arranged along an arrangement direction in parallel with the scan lines 11 and 12. The first clock signal line CK1 may be configured to be electrically connected to the first clock signal receiving terminal a in each of the first gate drive units 31; the second clock signal line XCK1 may be configured to be electrically connected to the second clock signal receiving terminal b in each of the first gate drive units 31; the third clock signal line CK2 may be configured to be electrically connected to the third clock signal receiving terminal c in each of the second gate drive units 41; and the fourth clock signal line XCK2 may be configured to be electrically connected to the fourth clock signal receiving terminal d in each of the second gate drive units 41. Therefore, the first clock signal line CK1 may be configured to transmit the first clock signal to the first gate drive unit 31, the second clock signal line XCK1 may be configured to transmit the second clock signal to the first gate drive unit 31, the third clock signal line CK2 may be configured to transmit the third clock signal to the second gate drive unit 41, and the fourth clock signal line XCK2 may be configured to transmit the fourth clock signal to the second gate drive unit 41.

On the basis of the configuration of above circuit structure, the first drive signal output terminal OUT1 of each first gate drive unit 31 may be further configured to be electrically connected to the scan line 11 of an odd-numbered row in the display region 01 and electrically connected to the first drive signal receiving terminal IN1 of the first gate drive unit 31 of a next stage. In such way, it may realize that the scan drive signal may be transmitted to the odd-numbered row scan line 11 through the first gate drive unit 31; the drive signal may be transmitted to the first gate drive unit 31 of a next stage; and the first gate drive unit 31 of the next stage may also transmit the scan drive signal to the scan line 11 of the odd-numbered row which is electrically connected to the first gate drive unit 31 of the next stage, thereby realizing the function of sequentially receiving the scan drive signal by the scan lines 11 of the odd-numbered rows. Meanwhile, each second drive signal output terminal OUT2 may be electrically connected to the scan line 12 of the even-numbered row in the display region 01 and be electrically connected to the second drive signal receiving terminal IN2 of the second gate drive unit 41 of the next stage. In such way, it may realize that the scan drive signal may be transmitted to the even-numbered row scan line 12 through the second gate drive unit 41; the drive signal may be transmitted to the second gate drive unit 41 of the next level; and the second gate drive unit 41 of the next stage may also transmit the scan drive signal to the scan line 12 of the even-numbered row which is electrically connected to the second gate drive unit 41 of the next stage, thereby realizing the function of sequentially receiving the scan drive signal by the scan lines 12 of the even-numbered rows.

Based on the configuration of the above circuit structure, the present disclosure provides a drive method of the display panel 100. For example, when M is 1 and N is 1, for displaying odd-numbered frames of pictures, the first clock signal, the third clock signal, the second clock signal, and the fourth clock signal may be controlled to be transmitted alternately and sequentially, that is, the first clock signal may be transmitted to its corresponding gate drive unit before the third clock signal, and then the second clock signal may be transmitted to its corresponding gate drive unit before the fourth clock signal; and for displaying even-numbered frames of pictures, the third clock signal, the first clock signal, the fourth clock signal, and the second clock signal may be controlled to be transmitted alternately and sequentially, that is, the third clock signal may be transmitted to its corresponding gate drive unit before the first clock signal, and then the fourth clock signal may be transmitted to its corresponding gate drive unit before the second clock signal. Therefore, it may realize that, in actual picture implementation stage, the scan lines 11 and 12 may be applied with the scan drive signal in the order of 1, 2, 1, 2, 1, 2 . . . in displaying odd-numbered frames of pictures, and the scan lines 11 and 12 may be applied with the scan drive signal in the order of 2, 1, 2, 1, 2, 1 . . . in displaying even-numbered frames of pictures. In such way, it may realize that the picture display luminous intensities may be superimposed and complemented in displaying odd-numbered frames of pictures and even-numbered frames of pictures, thereby avoiding the problem that the human eye can recognize the bright and dark lines in the display region 01, improving the display uniformity of the display panel 100, and making the display effect of the display panel 100 to be desirable.

Referring to FIGS. 1, 11, 13 and 14, optionally, the display panel 100 may further include the first start-up signal terminal STV1 and the second start-up signal terminal STV2; the first start-up signal terminal STV1 may be electrically connected to the first gate drive unit 31 of the first stage in the first gate drive module 30; and the second start-up signal terminal STV2 may be electrically connected to the second gate drive unit 41 of the first stage in the second gate drive module 40.

For example, the display panel 100 may further include the first start-up signal terminal STV1 and the second start-up signal terminal STV2 configured in the non-display region 02. The first start-up signal terminal STV1 may be configured to be electrically connected to the first gate drive unit 31 of the first stage in the first gate drive module 30 and transmit the first start-up signal to the first gate drive unit 31 of the first stage in the first gate drive module 30; and the first start-up signal may be transmitted to other cascaded first gate drive units 31 connected with each other through stage by stage. The second start-up signal terminal STV2 may be configured to be electrically connected to the second gate drive unit 41 of the first stage in the second gate drive module 40 and transmit the second start-up signal to the second gate drive unit 41 of the first stage in the second gate drive module 40; and the second start-up signal may be transmitted to other cascaded second gate drive units 41 connected with each other through stage by stage.

It should be noted that the configuration of the first start-up signal terminal STV1 and the second start-up signal terminal STV2 provided above, and their electrical connection relationship with the first gate drive module 30 and the second gate drive module 40 may be not related to whether the first gate drive module 30 and the second gate drive module 40 are arranged in one column or two columns.

In the first gate drive module 30, odd-numbered first gate drive units 31 may be electrically connected to the scan lines 11; and in the second gate drive module 40, even-numbered second gate drive units 41 may be electrically connected to the scan lines 12. At this point, it may realize that after the first start-up signal terminal STV1 and the second start-up signal terminal STV2 transmit the first start-up signal and the second start-up signal simultaneously, in each scan line unit 10 including two scan lines 11 and 12, the first scan line 11 may first receive the scan drive signal transmitted by the first gate drive unit 31, and then the second scan line 12 may receive the scan drive signal transmitted from the second gate drive unit 41. Therefore, it may realize that for displaying odd-numbered frames of pictures, the scan lines 11 and 12 may be applied with the scan drive signal in the order of 1, 2, 1, 2, 1, 2 . . . (the order of 1, 2, 3, 4 . . . shown in FIG. 7).

Based on that the first start-up signal terminal STV1 and the second start-up signal terminal STV2 are configured, the present disclosure provides a drive method of the display panel 100 as the following. For example, when M takes a value of 1 and N takes a value of 1, for displaying odd-numbered frames of pictures, the first start-up signal terminal STV1 and the second start-up signal terminal STV2 may be configured to be turned on simultaneously; and the first start-up signal and the second start-up signal may be simultaneously transmitted to the first gate drive unit 31 of the first stage and the second gate drive unit 41 of the first stage which are electrically connected to the first start-up signal terminal STV1 and the second start-up signal terminal STV2. In the first gate drive module 30, odd-numbered first gate drive units 31 may be electrically connected to the scan lines 11; and in the second gate drive module 40, even-numbered second gate drive units 41 may be electrically connected to the scan lines 12. At this point, it may realize that after the first start-up signal terminal STV1 and the second start-up signal terminal STV2 transmit the first start-up signal and the second start-up signal simultaneously, in each scan line unit 10 including two scan lines 11 and 12, the first scan line 11 may first receive the scan drive signal transmitted by the first gate drive unit 31, and then the second scan line 12 may receive the scan drive signal transmitted from the second gate drive unit 41. Therefore, it may realize that for displaying odd-numbered frames of pictures, the scan lines 11 and 12 may be applied with the scan drive signal in the order of 1, 2, 1, 2, 1, 2 . . . .

On such basis, for displaying even-numbered frames of pictures, the second start-up signal terminal STV2 may be configured to be turned on before the first start-up signal terminal STV1. The second start-up signal terminal STV2 may first transmit the second start-up signal to the second gate drive unit 41 of the first stage that is electrically connected to the second start-up signal terminal STV2; and then the first start-up signal terminal STV1 may transmit the first start-up signal to the first gate drive unit 31 of the first stage that is electrically connected to the first start-up signal terminal STV1. In the first gate drive module 30, odd-numbered first gate drive units 31 may be electrically connected to the scan lines 11 and in the second gate drive module 40, even-numbered second gate drive units 41 may be electrically connected to the scan lines 12. At this point, it may realize that in each scan line unit 10 including two scan lines 11 and 12, the second scan line 12 may first receive the scan drive signal transmitted by the second gate drive unit 41; and then the first scan line 11 in the same scan line unit 10 may receive the scan drive signal transmitted from the first gate drive unit 31. Therefore, for displaying even-numbered frames of pictures, the scan lines 11 and 12 may be applied with the scan drive signal in the order of 2, 1, 2, 1, 2, 1 . . . .

That is, in the present disclosure, by configuring the start-up time of the first start-up signal terminal STV1 and the second start-up signal terminal STV2 to be different, the order of the rows in which the pictures are turned on may be different, so that the picture display luminous intensities may be superimposed and complemented in displaying odd-numbered frames of pictures and even-numbered frames of pictures. It is equivalent to perform superimposition-type complementation improvement on the N frames of pictures which are displayed as that odd-numbered rows are brighter and even-numbered rows are darker by using the M frames of pictures which are displayed as that odd-numbered rows are darker and even-numbered rows are brighter, thereby avoiding the problem that the human eye may recognize the bright and dark lines in the display region 01, improving the display uniformity of the display panel 100, and making the display effect of the display panel 100 to be desirable.

Figure 16:
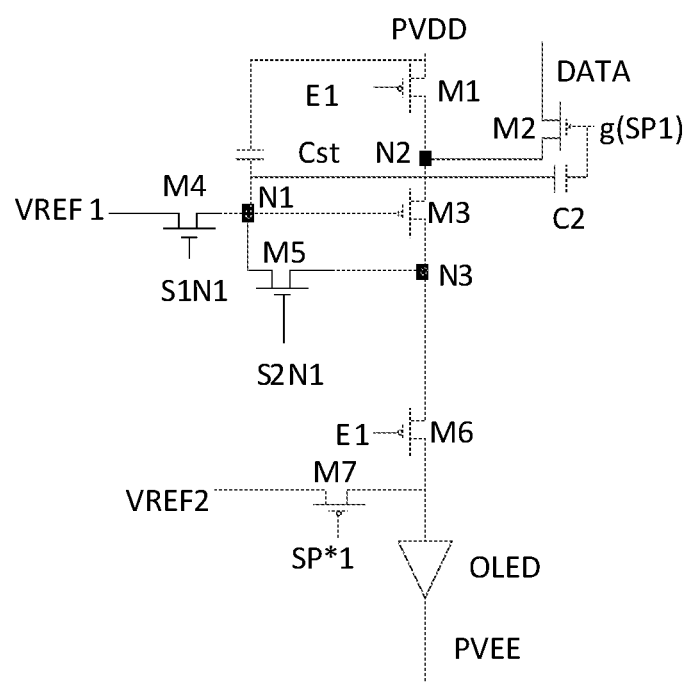
FIG. 16 illustrates a detailed structural schematic of a pixel drive circuit in FIG. 15 according to various embodiments of the present disclosure.

FIG. 16 illustrates a detailed structural schematic of the pixel drive circuit in FIG. 15 according to various embodiments of the present disclosure. Referring to FIGS. 1, 11 and 15, optionally, a pixel drive circuit 70 may further included, and each pixel drive circuit 70 may be electrically connected to the scan lines 11/12; and the pixel drive circuit 70 may include a first circuit control terminal g; and the first terminal of the first circuit control terminal g may be configured to receive the scan drive signal transmitted by the scan lines 11/12.

For example, the display region 01 of the display panel 100 provided by the present disclosure may further include the pixel drive circuit 70; each pixel drive circuit 70 may be electrically connected to the scan lines 11/12; each scan line 11/12 may be electrically connected to a plurality of pixel drive circuits 70, and each pixel drive circuit 70 may be configured with a light-emitting element OLED (organic light-emitting diode); and each pixel drive circuit 70 may be configured to control the light-emitting element OLED to be in an on-state or off-state according to the type of electrical signal received, thereby realizing the use of the display function of the display panel 100.

Each pixel drive circuit 70 may include the first circuit control terminal g. The first terminal of the first circuit control terminal g may be electrically connected to the scan lines 11/12 for receiving the scan drive signal transmitted by the scan lines 11/12 and transmitting the received scan drive signal to the control terminal of a second transistor M2 in the pixel drive circuit 70 which may be configured to control whether the second transistor M2 is turned on or not. When the scan drive signal controls the second transistor M2 to be in an on-state, the first terminal of the second transistor M2 may be electrically connected to a data signal which may be transmitted to the second node in the pixel drive circuit 70 through the second transistor M2. By adjusting the transmission order of two scan drive signals in each scan line unit 10, it may realize that the order in which the second transistors M2 is turned on in the pixel drive unit electrically connected to the scan line 11 or 12 of each row may be adjusted, and the order adjustment before and after the data signal is transmitted to the second node in the pixel driving circuit 70 may be realized. Therefore, when M is 1 and N is 1, the scan lines 11 and 12 may be applied with the scan drive signal in the order of 1, 2, 1, 2, 1, 2 . . . in displaying odd-numbered frames of pictures, and the scan lines 11 and 12 may be applied with the scan drive signal in the order of 2, 1, 2, 1, 2, 1 . . . in displaying even-numbered frames of pictures. In such way, it may realize that the picture display luminous intensities may be superimposed and complemented in displaying odd-numbered frames of pictures and even-numbered frames of pictures, thereby avoiding the problem that the human eye can recognize the bright and dark lines in the display region 01, improving the display uniformity of the display panel 100, and making the display effect of the display panel 100 to be desirable.

The circuit structure of the pixel drive circuit 70 shown in FIG. 16 is only an optional configuration manner provided by the present disclosure, which may not be limited in the present disclosure. Users may adjust detailed structure of the pixel drive circuit 70 according to requirements.

Figure 17:
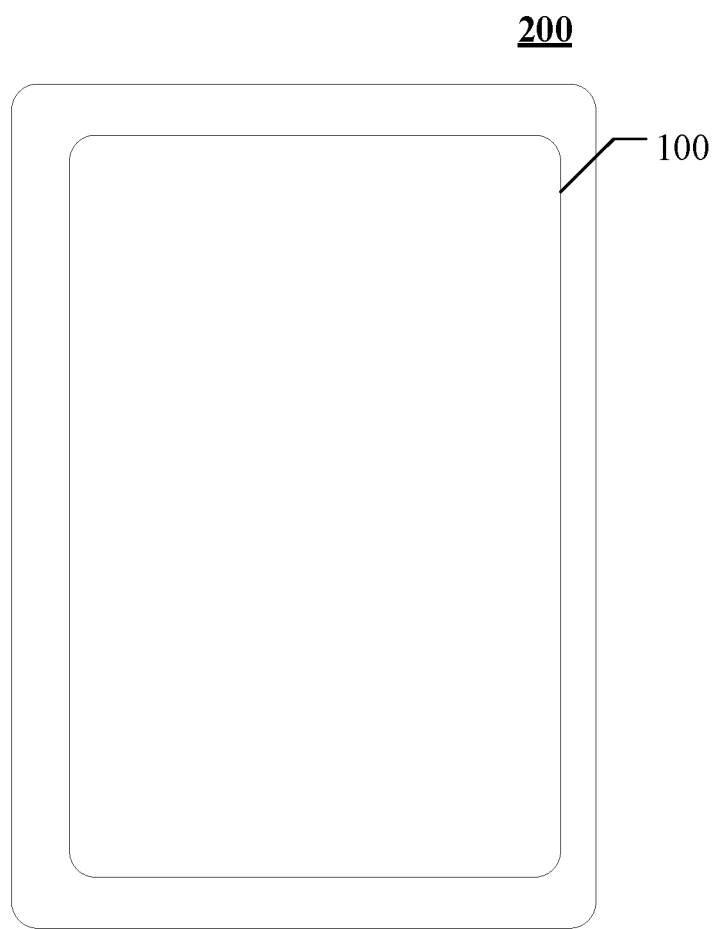
FIG. 17 illustrates a schematic of a display apparatus according to various embodiments of the present disclosure.

FIG. 17 illustrates a schematic of a display apparatus according to various embodiments of the present disclosure. Referring to FIGS. 1-17, based on the same inventive concept, the present disclosure further provides a display apparatus 200. The display apparatus 200 may include a display panel 100 which may be any one of the display panels 100 provided in the present disclosure.

It should be noted that, embodiments of the display apparatus 200 provided by embodiments of the present disclosure may refer to embodiments of the display panel 100 described above, which may not be described in detail herein. The display apparatus 200 provided in the present disclosure may be any product or component with display function, such as a mobile phone, a tablet computer, a television, a monitor, a notebook computer, a navigator, and the like.

From above-mentioned embodiments, it may be seen that the display panel and its drive method, and the display apparatus provided by the present disclosure may achieve at least following beneficial effects.

In the display panel and its drive method, and the display apparatus provided by the present disclosure, each scan line unit may be configured to include two scan lines; the plurality of scan lines may receive the scan drive signal sequentially in displaying one frame picture; in displaying another adjacent frame picture, the scan line units may receive the scan drive signal sequentially; and after the second scan line of two scan lines in each scan line unit first receives the scan drive signal, the first scan line may be configured to receive the scan drive signal. Through such drive manner, in displaying two adjacent frames of pictures, the scan drive signal may be transmitted to the scan lines in order from top to bottom (in the order of 1, 2, 1, 2, 1, 2 . . . ) in one frame picture; and the scan drive signal may be transmitted to the scan lines in the order of 2, 1, 2, 1, 2, 1 . . . in another frame picture. Therefore, the picture display luminous intensities of each row in two adjacent frames of pictures may be neutralized between such two frames, such that the picture display luminous intensities of each row in two adjacent frames of pictures may tend to be consistent, thereby improving the problem of uneven picture display effect.

Although some embodiments of the present disclosure have been described in detail through examples, those skilled in the art should understand that above-mentioned examples are provided for illustration only and not for the purpose of limiting the scope of the disclosure. Those skilled in the art should understand that modifications may be made to above-mentioned embodiments without departing from the scope and spirit of the present disclosure. The scope of the present disclosure may be defined by appended claims.

What is claimed is:

1. A drive method of a display panel, wherein the display panel includes a display region and a non-display region surrounding the display region, the display region includes a plurality of scan line units, and each scan line unit includes two scan lines which extend along a first direction and are arranged along a second direction, the method comprising: for displaying M frames of pictures, receiving a scan drive signal sequentially by a plurality of scan lines arranged along the second direction; and for displaying N frames of pictures adjacent to the M frames of pictures, receiving the scan drive signal sequentially by the plurality of scan line units arranged along the second direction; and along the second direction, for each same scan line unit, receiving the scan drive signal by an ith scan line after an (i+1)th scan line receives the scan drive signal, wherein 1<M<3, M is an integer, 1<N<3, N is a positive integer, and i=1; wherein: the non-display region of the display panel further includes a first gate drive module and a second gate drive module; the first gate drive module includes K cascaded first gate drive units connected with each other; the second gate drive module includes K cascaded second gate drive units connected with each other; and along the second direction, the K cascaded first gate drive units and the K cascaded second gate drive units are sequentially connected to the plurality of scan lines alternately, wherein K is a positive integer; along the first direction, the second gate drive module is on a side of the first gate drive module adjacent to the display region, or the second gate drive module is on a side of the display region away from the first gate drive module; and the K cascaded first gate drive units are sequentially arranged along the second direction, and the cascaded K second gate drive units are sequentially arranged along the second direction; and the drive method of the display panel includes: for displaying the M frames of pictures, along the second direction, after the ith scan line in each scan line unit first receives the scan drive signal transmitted by a first gate drive unit of the K cascaded first gate drive units, receiving the scan drive signal transmitted by a second gate drive unit of the K cascaded second gate drive units by the (i+1)th scan line in the same each scan line unit; and for displaying the N frames of pictures adjacent to the M frames of pictures, along the second direction, after the (i+1)th scan line in each scan line unit first receives the scan drive signal transmitted by the second gate drive unit of the K cascaded second gate drive units, receiving the scan drive signal transmitted by the first gate drive unit of the K cascaded first gate drive units by the ith scan line in the same scan line unit; wherein: the display panel further includes a first clock signal line group; the first clock signal line group includes a first clock signal line and a second clock signal line; the first clock signal line and the second clock signal line are configured to respectively transmit a first clock signal and a second clock signal to the first gate drive unit and the second gate drive unit; the first clock signal line is electrically connected to each first gate drive unit and each second gate drive unit; the second clock signal line is electrically connected to each first gate drive unit and each second gate drive unit; and the drive method of the display panel includes: for displaying of the M frames of pictures, alternately and sequentially transmitting, in order, the second clock signal and the first clock signal; and for displaying the N frames of pictures adjacent to the M frames of pictures, alternately and sequentially transmitting, in order, the first clock signal and the second clock signal.

2. The method according to claim 1, wherein:
M=1 and N=1.

3. The method according to claim 1, wherein:
the non-display region of the display panel further includes a first gate drive module and a second gate drive module; the first gate drive module includes K cascaded first gate drive units connected with each other; the second gate drive module includes K cascaded second gate drive units connected with each other; and along the second direction, the K cascaded first gate drive units and the K cascaded second gate drive units are sequentially connected to the plurality of scan lines alternately, wherein K is a positive integer;
along the second direction, the K cascaded first gate drive units and the K cascaded second gate drive units are alternately and sequentially arranged; and
the drive method of the display panel includes:
for displaying the M frames of pictures, along the second direction, after the ith scan line in each scan line unit first receives the scan drive signal transmitted by a first gate drive unit of the K cascaded first gate drive units, receiving the scan drive signal transmitted by a second gate drive unit of the K cascaded second gate drive units by the (i+1)th scan line in the same each scan line unit; and
for displaying the N frames of pictures adjacent to the M frames of pictures, along the second direction, after the (i+1)th scan line in each scan line unit first receives the scan drive signal transmitted by the second gate drive unit of the K cascaded second gate drive units, receiving the scan drive signal transmitted by the first gate drive unit of the K cascaded first gate drive units by the ith scan line in the same scan line unit.

4. The method according to claim 1, wherein: the display panel further includes a first start-up signal terminal and a second start-up signal terminal; the first start-up signal terminal is electrically connected to a first gate drive unit at a first stage in the first gate drive module; the second start-up signal terminal is electrically connected to a second gate drive unit at a first stage in the second gate drive module; the first start-up signal terminal is configured to transmit a first start-up signal to the first gate drive unit at the first stage in the first gate drive module; and the second start-up signal terminal is configured to transmit a second start-up signal to the second gate drive unit at the first stage in the second gate drive module; and the drive method of the display panel includes: for displaying the M frames of pictures, simultaneously transmitting the first start-up signal and the second start-up signal by the first start-up signal terminal and the second start-up signal terminal; and for displaying the N frames of pictures adjacent to the M frames of pictures, after the second start-up signal terminal transmits the second start-up signal, transmitting the first start-up signal by the first start-up signal terminal.

5. The method according to claim 1, wherein: the display panel further includes a first start-up signal terminal; the first start-up signal terminal is electrically connected to a first gate drive unit at a first stage in the first gate drive module and electrically connected to a second gate drive unit at the first stage in the second gate drive module; and the first start-up signal terminal is configured to transmit a first start-up signal to the first gate drive unit at the first stage in the first gate drive module and configured to transmit the first start-up signal to the second gate drive unit at the first stage in the second gate drive module; and the drive method of the display panel includes: for displaying the M frames of pictures, simultaneously transmitting the first start-up signal, by the first start-up signal terminal, to the first gate drive unit at the first stage and the second gate drive unit at the first stage; and for displaying the N frames of pictures adjacent to the M frames of pictures, simultaneously transmitting the first start-up signal, by the first start-up signal terminal, to the first gate drive unit at the first stage and the second gate drive unit at the first stage.

6. A display panel, comprising: a display region and a non-display region surrounding the display region, wherein: the display region includes a plurality of scan line units, and each scan line unit includes two scan lines which extend along a first direction and are arranged along a second direction; and the non-display region further includes a first gate drive module and a second gate drive module, wherein the first gate drive module includes K cascaded first gate drive units connected with each other; the second gate drive module includes K cascaded second gate drive units connected with each other; and along the second direction, the K cascaded first gate drive units and the K cascaded second gate drive units are sequentially connected to a plurality of scan lines alternately, wherein K is a positive integer;

wherein for displaying M frames of pictures, receiving a scan drive signal sequentially by the plurality of scan lines arranged along the second direction; and for displaying N frames of pictures adjacent to the M frames of pictures, receiving the scan drive signal sequentially by the plurality of scan line units arranged along the second direction; and along the second direction, for each same scan line unit, receiving the scan drive signal by an ith scan line after an (i+1)th scan line receives the scan drive signal, wherein $1<M<3$, M is an integer, $1<N<3$, N is a positive integer, and $i=1$;

wherein the display panel further includes a first clock signal line group; the first clock signal line group includes a first clock signal line and a second clock signal line; the first clock signal line and the second clock signal line are configured to respectively transmit a first clock signal and a second clock signal to the first gate drive unit and the second gate drive unit; the first clock signal line is electrically connected to each first gate drive unit and each second gate drive unit; the second clock signal line is electrically connected to each first gate drive unit and each second gate drive unit; wherein for displaying of the M frames of pictures, alternately and sequentially transmitting, in order, the second clock signal and the first clock signal; and for displaying the N frames of pictures adjacent to the M frames of pictures, alternately and sequentially transmitting, in order, the first clock signal and the second clock signal.

7. The display panel according to claim 6, wherein:
along the second direction, the K cascaded first gate drive units and the K cascaded second gate drive units are alternately and sequentially arranged; or
along the first direction, the second gate drive module is on a side of the first gate drive module adjacent to the display region, or the second gate drive module is on a side of the display region away from the first gate drive module; and the K cascaded first gate drive units are sequentially arranged along the second direction, and the cascaded K second gate drive units are sequentially arranged along the second direction.

8. The display panel according to claim 7, wherein:
each first gate drive unit includes a first clock signal receiving terminal, a second clock signal receiving terminal, a first drive signal receiving terminal and a first drive signal output terminal; and each second gate drive unit includes a third clock signal receiving terminal, a fourth clock signal receiving terminal, a second drive signal receiving terminal and a second drive signal output terminal;
the display panel further includes a first clock signal line group; and the first clock signal line group includes a first clock signal line and a second clock signal line; the first clock signal line is electrically connected to the first clock signal receiving terminal of each first gate drive unit and electrically connected to the third clock signal receiving terminal of each second gate drive unit; and the second clock signal line is electrically connected to the second clock signal receiving terminal of each first gate drive unit and electrically connected to the fourth clock signal receiving terminal of each second gate drive unit; and
each first drive signal output terminal is electrically connected to a scan line in an odd-numbered row and electrically connected to a first drive signal receiving terminal of a first gate drive unit at a next stage; and each second drive signal output terminal is electrically connected to a scan line in an even-numbered row and electrically connected to a second drive signal receiving terminal of a second gate drive unit at a next stage.

9. The display panel according to claim 8, wherein:
the display panel further includes a first start-up signal terminal and a second start-up signal terminal; the first start-up signal terminal is electrically connected to a first gate drive unit at a first stage in the first gate drive module; and the second start-up signal terminal is electrically connected to a second gate drive unit at a first stage in the second gate drive module.

10. The display panel according to claim 7, wherein:
each first gate drive unit includes a first clock signal receiving terminal, a second clock signal receiving terminal, a first drive signal receiving terminal and a first drive signal output terminal; and each second gate drive unit includes a third clock signal receiving terminal, a fourth clock signal receiving terminal, a second drive signal receiving terminal and a second drive signal output terminal;

the display panel further includes a first clock signal line group and a second clock signal line group; the first clock signal line group includes a first clock signal line and a second clock signal line; and the second clock signal line group includes a third clock signal line and a fourth clock signal line;

the first clock signal line is electrically connected to the first clock signal receiving terminal of each first gate drive unit, and the second clock signal line is electrically connected to the second clock signal receiving terminal of each first gate drive unit;

the third clock signal line is electrically connected to the third clock signal receiving terminal of each second gate drive unit, and the fourth clock signal line is electrically connected to the fourth clock signal receiving terminal of each second gate drive unit; and each first drive signal output terminal is electrically connected to a scan line in an odd-numbered row and electrically connected to a first drive signal receiving terminal of a first gate drive unit at a next stage; and each second drive signal output terminal is electrically connected to a scan line in an even-numbered row and electrically connected to a second drive signal receiving terminal of a second gate drive unit at a next stage.

11. The display panel according to claim 6, further including:

a pixel drive circuit, wherein each pixel drive circuit is electrically connected to a scan line of the plurality of scan lines; and the pixel drive circuit includes a first circuit control terminal, and a first terminal of the first circuit control terminal is configured to receive a scan drive signal transmitted by the scan line.

12. A display apparatus, comprising: a display panel, comprising: a display region and a non-display region surrounding the display region, wherein: the display region includes a plurality of scan line units, and each scan line unit includes two scan lines which extend along a first direction and are arranged along a second direction; and the non-display region further includes a first gate drive module and a second gate drive module, wherein the first gate drive module includes K cascaded first gate drive units connected with each other; the second gate drive module includes K cascaded second gate drive units connected with each other; and along the second direction, the K cascaded first gate drive units and the K cascaded second gate drive units are sequentially connected to a plurality of scan lines alternately, wherein K is a positive integer; wherein for displaying M frames of pictures, receiving a scan drive signal sequentially by the plurality of scan lines arranged along the second direction; and for displaying N frames of pictures adjacent to the M frames of pictures, receiving the scan drive signal sequentially by the plurality of scan line units arranged along the second direction; and along the second direction, for each same scan line unit, receiving the scan drive signal by an ith scan line after an (i+1)th scan line receives the scan drive signal, wherein $1<M<3$, M is an integer, $1<N<3$, N is a positive integer, and $i=1$;

wherein the display panel further includes a first clock signal line group; the first clock signal line group includes a first clock signal line and a second clock signal line; the first clock signal line and the second clock signal line are configured to respectively transmit a first clock signal and a second clock signal to the first gate drive unit and the second gate drive unit; the first clock signal line is electrically connected to each first gate drive unit and each second gate drive unit; the second clock signal line is electrically connected to each first gate drive unit and each second gate drive unit; wherein for displaying of the M frames of pictures, alternately and sequentially transmitting, in order, the second clock signal and the first clock signal; and for displaying the N frames of pictures adjacent to the M frames of pictures, alternately and sequentially transmitting, in order, the first clock signal and the second clock signal.

* * * * *